United States Patent
Lin et al.

(10) Patent No.: US 12,527,014 B2
(45) Date of Patent: Jan. 13, 2026

(54) AMORPHOUS BOTTOM ELECTRODE STRUCTURE FOR MIM CAPACITORS

(71) Applicant: Taiwan Semiconductor Manufacturing Company, Ltd., Hsinchu (TW)

(72) Inventors: Hsing-Lien Lin, Hsin-Chu (TW); Jui-Lin Chu, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/664,389

(22) Filed: May 15, 2024

(65) Prior Publication Data

US 2024/0304659 A1    Sep. 12, 2024

Related U.S. Application Data

(62) Division of application No. 17/574,030, filed on Jan. 12, 2022, now Pat. No. 12,021,113.

(Continued)

(51) Int. Cl.
*H10D 1/68* (2025.01)

(52) U.S. Cl.
CPC .................. *H10D 1/692* (2025.01)

(58) Field of Classification Search
CPC .............. H10D 1/684; H10D 1/696
See application file for complete search history.

(56) References Cited

U.S. PATENT DOCUMENTS

| 6,339,009 B1 | 1/2002 | Lee et al. |
| 2002/0079506 A1* | 6/2002 | Komoto ............ H10H 20/8515 257/99 |

(Continued)

FOREIGN PATENT DOCUMENTS

| KR | 100774816 A | 11/2007 |
| TW | 200947671 A | 11/2009 |

OTHER PUBLICATIONS

Chemistry LibreTexts "Definitions of Oxidation and Reduction" The date of publication is unknown. Retrieved online on Oct. 25, 2021 from https://chem.libretexts.org/Bookshelves/Analytical_Chemistry/Supplemental_Modules_(Analytical_Chemistry)/Electrochemistry/Redox_Chemistry/Defintions.

(Continued)

*Primary Examiner* — John A Bodnar
(74) *Attorney, Agent, or Firm* — Eschweiler & Potashnik, LLC

(57) ABSTRACT

Various embodiments of the present disclosure are directed towards an amorphous bottom electrode structure (BES) for a metal-insulator-metal (MIM) capacitor. The MIM capacitor comprises a bottom electrode, an insulator layer overlying the bottom electrode, and a top electrode overlying the insulator layer. The bottom electrode comprises a crystalline BES and the amorphous BES, and the amorphous BES overlies the crystalline BES and forms a top surface of the bottom electrode. Because the amorphous BES is amorphous, instead of crystalline, a top surface of the amorphous BES may have a small roughness compared to that of the crystalline BES. Because the amorphous BES forms the top surface of the bottom electrode, the top surface of the bottom electrode may have a small roughness compared to what it would otherwise have if the crystalline BES formed the top (Continued)

surface. The small roughness may improve a lifespan of the MIM capacitor.

20 Claims, 21 Drawing Sheets

Related U.S. Application Data

(60) Provisional application No. 63/255,576, filed on Oct. 14, 2021.

(56) References Cited

U.S. PATENT DOCUMENTS

| | | |
|---|---|---|
| 2002/0182820 A1 | 12/2002 | Choi et al. |
| 2004/0222493 A1 | 11/2004 | Sato et al. |
| 2007/0145525 A1 | 6/2007 | Wang et al. |
| 2008/0239815 A1 | 10/2008 | Nakamura et al. |
| 2008/0318378 A1* | 12/2008 | Wu .............. H10B 12/033 257/E21.645 |
| 2009/0316332 A1 | 12/2009 | Okubo et al. |
| 2011/0018100 A1 | 1/2011 | Nakagawa et al. |
| 2015/0380477 A1 | 12/2015 | Huang et al. |
| 2016/0104762 A1 | 4/2016 | Triyoso et al. |
| 2016/0163781 A1 | 6/2016 | Lin et al. |
| 2017/0213959 A1 | 7/2017 | Gibson et al. |
| 2018/0277621 A1 | 9/2018 | Ando et al. |
| 2020/0006183 A1 | 1/2020 | Huang et al. |
| 2021/0091169 A1 | 3/2021 | Lin et al. |

OTHER PUBLICATIONS

Non-Final Office Action dated Sep. 22, 2023 for U.S. Appl. No. 17/574,030.

Notice of Allowance dated Feb. 22, 2024 for U.S. Appl. No. 17/574,030.

* cited by examiner

US 12,527,014 B2

AMORPHOUS BOTTOM ELECTRODE STRUCTURE FOR MIM CAPACITORS

REFERENCE TO RELATED APPLICATION

This application is a Divisional of U.S. application Ser. No. 17/574,030, filed on Jan. 12, 2022, which claims the benefit of U.S. Provisional Application No. 63/255,576, filed on Oct. 14, 2021. The contents of the above-referenced patent applications are hereby incorporated by reference in their entirety.

BACKGROUND

Integrated circuits (ICs) are formed on semiconductor dies comprising millions or billions of transistors. The transistors are configured to act as switches and/or to produce power gains so as to enable logical functionality. ICs also comprise passive devices used to control gains, time constants, and other IC characteristics. One type of passive device is a metal-insulator-metal (MIM) capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
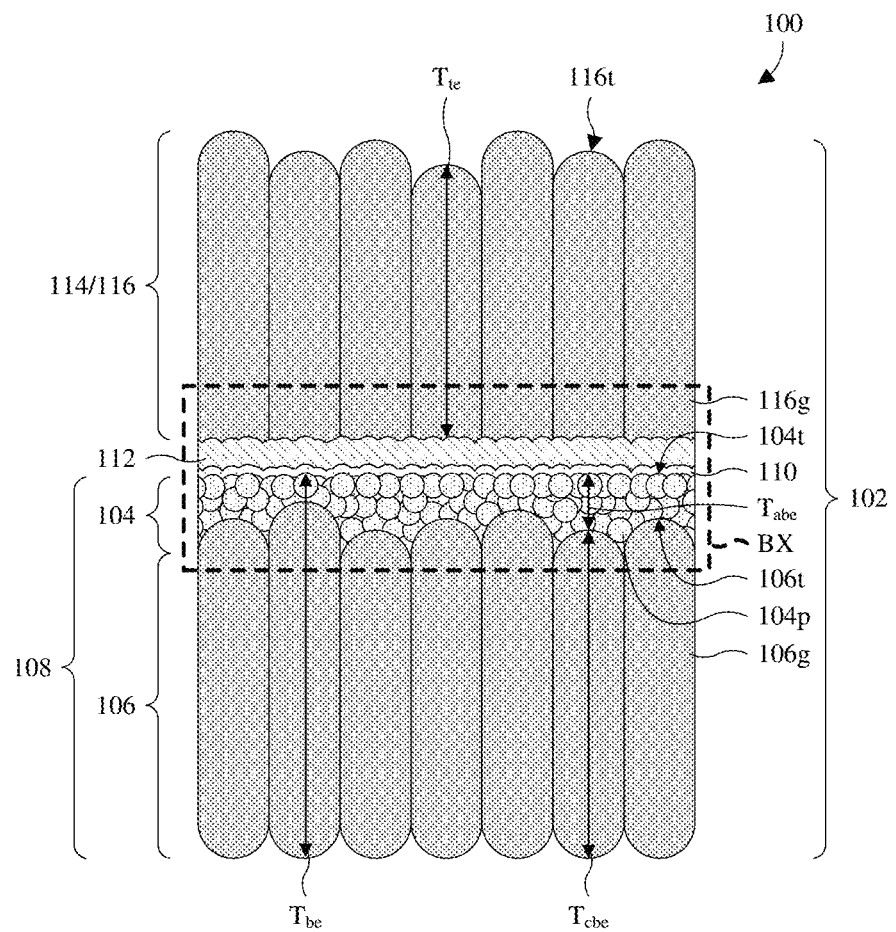
FIG. 1 illustrates a cross-sectional view of some embodiments of a metal-insulator-metal (MIM) capacitor comprising an amorphous bottom electrode structure (BES).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) capacitor may comprise a bottom electrode, an insulator layer overlying the bottom electrode, and a top electrode overlying the insulator layer. Further, the MIM capacitor may comprise an interfacial layer that forms at an interface between the insulator layer and the bottom electrode as a matter of course. The bottom electrode may be crystalline titanium nitride formed using physical vapor deposition (PVD) due to, among other things, low cost and high throughput. However, when formed as such, the bottom electrode may be wholly or substantially formed of columnar grains. Because of the columnar grains, a top surface of the bottom electrode and hence the interface may have large roughness and poor quality. Such a large roughness may, for example, be an average roughness of about 0.7-0.8 nanometers or some other suitable value. The poor quality may degrade electric field uniformity across the insulator layer and may hence degrade performance of the MIM capacitor.

A hydrogen gas (e.g., $H_2$) high pressure anneal (HPA) may be performed following formation of the MIM capacitor. For example, at certain process nodes, the hydrogen gas HPA may be performed to repair performance degradation of front-end devices. Because of the small size of hydrogen and the high mobility of hydrogen, hydrogen ions (e.g., H+)

from the hydrogen gas HPA may diffuse to the interface between the insulator layer and the bottom electrode. The hydrogen ions may cause the bottom electrode and the insulator layer to undergo localized hydrogen reduction reactions. The localized hydrogen reduction reactions may form acceptor-like traps at the interfacial layer and oxygen vacancies at the insulator layer. The oxygen vacancies facilitate leakage current through the insulator layer. Further, the acceptor-like traps trap hydrogen ions, which reduces a barrier height of the interfacial layer and facilitates electron hopping through the insulator layer, thereby further increasing leakage current.

Because of the large roughness, surface area at the interface between the bottom electrode and the insulator layer may be large and hence a large amount of localized hydrogen reduction reactions may result. Because of the large amount of localized hydrogen reduction reactions, a large amount of acceptor-like traps may form and a large amount of oxygen vacancies may form. As such, leakage current through the insulator layer may be high and hence a time-dependent dielectric breakdown (TDDB) of the insulator layer may be low. For example, the low TDDB may be less than about 0.1 years or some other suitable value.

Various embodiments of the present disclosure are directed towards an amorphous bottom electrode structure (BES) for a MIM capacitor. The MIM capacitor comprises a bottom electrode, an insulator layer overlying the bottom electrode, and a top electrode overlying the insulator layer. Further, the MIM capacitor comprises an interfacial layer at an interface between the bottom electrode and the insulator layer. The bottom electrode comprises a crystalline BES and the amorphous BES. The amorphous BES overlies the crystalline BES and forms a top surface of the bottom electrode. Because the amorphous BES is amorphous, instead of crystalline, a top surface of the amorphous BES may have a small roughness compared to that of the crystalline BES. Because the amorphous BES forms the top surface of the bottom electrode, the top surface of the bottom electrode may have a small roughness compared to what it would otherwise have if the amorphous BES was omitted and the crystalline BES formed the top surface of the bottom electrode. The small roughness may improve electric field uniformity across the insulator layer and hence performance of the MIM capacitor.

As above, a hydrogen gas HPA may be performed after forming the MIM capacitor. Because of the hydrogen gas HPA, hydrogen ions may diffuse to the interface between the insulator layer and the bottom electrode. The hydrogen may cause the bottom electrode and the insulator layer to undergo localized hydrogen reduction reactions that form acceptor-like traps at the interfacial layer and oxygen vacancies at the insulator layer. Because of the small roughness at the top surface of the bottom electrode, surface area at the interface may be small and hence a small amount of localized hydrogen reduction reactions may result. Because of the small amount of localized hydrogen reduction reactions, a small amount of acceptor-like traps may form and a small amount of oxygen vacancies may form. As such, leakage current through the insulator layer may be low and hence a TDDB of the insulator layer may be high. For example, the high TDDB may be greater than about 88 years or some other suitable value.

With reference to FIG. 1, a cross-sectional view 100 of some embodiments of a metal-insulator-metal (MIM) capacitor 102 comprising an amorphous BES 104 is provided. The MIM capacitor 102 may, for example, be employed as a decoupling capacitor for Internet of Things (IoT) applications, computer server applications, other suitable application(s), or any combination of the foregoing. The amorphous BES 104 overlies a crystalline BES 106 and forms a bottom electrode 108 with the crystalline BES 106. Further, an interfacial layer 110 overlies the bottom electrode 108, an insulator layer 112 overlies the interfacial layer 110, and a top electrode 114 overlies the insulator layer 112.

Because the amorphous BES 104 is amorphous, instead of crystalline, a top surface 104$t$ of the amorphous BES 104 may have a small roughness compared to a top surface 106$t$ of the crystalline BES 106. Because the amorphous BES 104 forms a top surface of the bottom electrode 108, the top surface may have a small roughness compared to what it would otherwise have if the amorphous BES 104 was omitted and the crystalline BES 106 formed the top surface. The small roughness at the top surface of the bottom electrode 108 may improve electric field uniformity across the insulator layer 112 during operation of the MIM capacitor 102 and may hence improve performance of the MIM capacitor 102. Further, the small roughness may improve thickness uniformity of the insulator layer 112 and reduce localized thinning of the insulator layer 112. Areas of localized thinning have increased leakage current, whereby breakdown voltage is decreased and TDDB is decreased.

Figure 2:
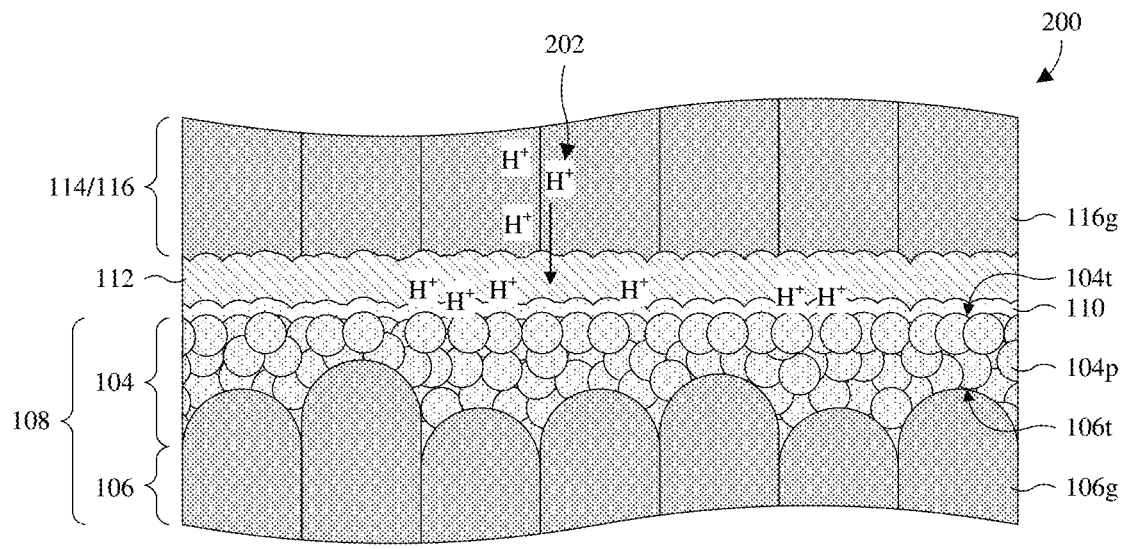
FIG. 2 illustrates an enlarged cross-sectional view of some embodiments of a portion of the MIM capacitor of FIG. 1 during a hydrogen gas high pressure anneal (HPA).

As seen hereafter, the MIM capacitor 102 may be integrated into an integrated circuit (IC) chip. Further, in at least some embodiments, a hydrogen gas HPA may be performed after forming the MIM capacitor 102 while manufacturing the IC chip. For example, the hydrogen gas HPA may be performed to repair performance degradation of front-end devices. Such performance degradation may, for example, be from crystalline damage caused by back-end processing performed after forming the front-end devices. With reference to FIG. 2, an enlarged cross-sectional view 200 of some embodiments of a portion of the MIM capacitor 102 of FIG. 1 during the hydrogen gas HPA is provided. The portion corresponds to box BX in FIG. 1.

During the hydrogen gas HPA, hydrogen ions (e.g., H+) 202 may diffuse through the top electrode 114 and the insulator layer 112 to an interface between the bottom electrode 108 and the insulator layer 112. At the interface, the hydrogen ions 202 may cause the bottom electrode 108 and the insulator layer 112 to undergo localized hydrogen reduction reactions. The localized hydrogen reduction reactions may form acceptor-like traps at the interfacial layer 110. Further, the localized hydrogen reduction reactions may change a stoichiometry of the insulator layer 112 and may form oxygen vacancies at the insulator layer 112.

Because of the small roughness at the top surface of the bottom electrode 108, surface area at the top surface, and hence at the interface between the bottom electrode 108 and the insulator layer 112, may be small. Because of the small surface area, a small amount of localized hydrogen reduction reactions may result. Because of the small amount of localized hydrogen reduction reactions, a small amount of acceptor-like traps may form at the interfacial layer 110 and a small amount of oxygen vacancies may form at the insulator layer 112.

The acceptor-like traps trap the hydrogen ions 202, which decreases a barrier height of the interfacial layer 110 and increases electron hopping through the insulator layer 112. Hence, the acceptor-like traps increase leakage current through the insulator layer 112, decrease a TDDB of the insulator layer 112, and decrease a breakdown voltage of the insulator layer 112. However, because there may be a small amount of acceptor-like traps, the acceptor-like traps may have a small effect on the barrier height. Hence, electron hopping may be low, leakage current may be low, TDDB may be high, and breakdown voltage may be high.

The oxygen vacancies increase leakage current through the insulator layer 112. Hence, the oxygen vacancies decrease a TDDB of the insulator layer 112 and decrease a breakdown voltage of the insulator layer 112. However, because there may be a small amount of oxygen vacancies, the oxygen vacancies have a small effect on leakage current. Hence, TDDB may be high and breakdown voltage may be high.

In some embodiments, the high TDDB is greater than about 10 years, about 80 years, about 88 years, or some other suitable value. In some embodiments, the TDDB is one or two or more magnitudes greater with the amorphous BES 104 forming the top surface of the bottom electrode 108 than with the crystalline BES 106 forming the top surface. In some embodiments, TDDB is measured at about 125 degrees Celsius or some other suitable value. In some embodiments, the high breakdown voltage is greater than or equal to about 4.2 volts, about 4.8 volts, about 5 volts, or some other suitable value.

Referring back to FIG. 1, the amorphous BES 104 comprises a random or non-orderly arrangement of particles 104p. The particles 104p may, for example, be or comprise molecules, atoms, other suitable particle(s), or any combination of the foregoing. Because of the random or non-orderly arrangement of the particles 104p, the top surface 104t of the amorphous BES 104 may have a small roughness as above. Because of the small roughness, the top surface 104t of the amorphous BES 104 has a lesser surface area than the top surface 106t of the crystalline BES 106 and/or a lesser surface area than the top surface 116t of the crystalline TES 116.

In embodiments, the small roughness is an average roughness (e.g., Ra) less than about 0.2 nanometers, 0.1 nanometers, or some other suitable value. If the roughness is too high (e.g., greater than about 0.2 nanometers), a large amount of localized hydrogen reduction reactions may occur, thereby leading to high leakage current, low TDDB, and low breakdown voltage. In some embodiments, the low roughness is an average roughness less than that at the top surface 106t of the crystalline BES 106. Roughness may, for example, be measured by atomic force microscopy (AFM) or the like.

In some embodiments, a thickness $T_{abe}$ of the amorphous BES 104 is greater than or equal to about 3 nanometers, about 5 nanometers, or some other suitable value, and/or is about 3-5 nanometers, about 5-10 nanometers, or some other suitable value. If the thickness $T_{abe}$ is too small (e.g., less than about 3 nanometers), the amorphous BES 104 may be unable to fully fill recesses in the top surface 106t of the crystalline BES 106, whereby the top surface 104t of the amorphous BES 104 may have a large roughness and the insulator layer 112 may have a low TDDB. If the thickness $T_{abe}$ is too large (e.g., more than about 10 nanometers), manufacturing costs may be high and manufacturing throughput may be low. For example, depositing amorphous material may be more costly than depositing crystalline material.

The crystalline BES 106 has an orderly or semi-orderly arrangement of columnar crystalline grains 106g, which are vertically elongated. In some embodiments, the crystalline BES 106 additionally or alternatively has equiaxed crystalline grains (not shown). Because of the orderly or semi-orderly arrangement of the columnar crystalline grains 106g, the top surface 106t of the crystalline BES 106 may have high roughness.

In some embodiments, the high roughness is an average roughness (e.g., Ra) greater than about 0.7 nanometers or some other suitable value, or between about 0.7-0.8 nanometers or some other suitable value. As described above, if the top surface of the bottom electrode 108 had the high roughness at the top surface 106t of the crystalline BES 106, the TDDB of the insulator layer 112 may be low. In some embodiments, a thickness $T_{cbe}$ of the crystalline BES 106 is less than about 57 nanometers, about 50 nanometers, or some other suitable value, and/or is about 50-57 nanometers or some other suitable value.

In some embodiments, a thickness $T_{be}$ of the bottom electrode 108 is less than or about equal to about 60 nanometers, about 50 nanometers, or some other suitable value, and/or is about 50-60 nanometers or some other suitable value. Further, in some embodiments, the thickness $T_{be}$ of the bottom electrode 108 is a sum of the thickness $T_{cbe}$ of the crystalline BES 106 and the thickness $T_{abe}$ of the amorphous BES 104.

The amorphous and crystalline BESs 104, 106 are conductive and may, for example, be or comprise titanium nitride (e.g., TiN), tantalum nitride (e.g., TaN), some other suitable conductive material(s), or any combination of the foregoing. In some embodiments, the amorphous and crystalline BESs 104, 106 are the same material. For example, the amorphous and crystalline BESs 104, 106 may be or comprise titanium nitride or some other suitable material. In some embodiments, the amorphous and crystalline BESs 104, 106 are different materials. For example, the amorphous BES 104 may be or comprise titanium nitride or some other suitable conductive material, and/or the crystalline BES 106 may be or comprise titanium or some other suitable conductive material.

The insulator layer 112 overlies the bottom electrode 108 and may, for example, be or comprise silicon oxide, a metal oxide dielectric, a high k dielectric, some other suitable dielectric(s), or any combination of the foregoing. The metal oxide dielectric may, for example, be or comprise zirconium oxide, aluminum oxide, hafnium oxide, some other suitable metal oxide dielectric(s), or any combination of the foregoing.

The interfacial layer 110 is at the interface between the insulator layer 112 and the bottom electrode 108 and is oxide formed by oxidation of the bottom electrode 108. For example, to the extent that the amorphous BES 104 is titanium nitride, the interfacial layer 110 may be an oxide of titanium nitride and may hence be titanium oxynitride (e.g., TiOxNy, where x and y are variables). Other suitable materials are, however, amenable.

In some embodiments, the bottom electrode 108 oxidizes in response to oxygen from the insulator layer 112, and/or oxygen from an ambient atmosphere of the bottom electrode 108 before formation of the insulator layer 112. In some embodiments, the interfacial layer 110 is plasma treated before formation of the insulator layer 112. In other embodiments, the interfacial layer 110 is not plasma treated. The plasma treatment may, for example, expose the interfacial layer 110 to plasma formed from nitrous oxide (e.g., $N_2O$) and/or other suitable gas(es).

To the extent that the interfacial layer 110 is plasma treated, the interfacial layer 110 may, for example, be native oxide of the bottom electrode 108 plasma treated with plasma formed from nitrous oxide. The native oxide may, for example, be formed by reaction of the amorphous BES 104 with oxygen in an ambient atmosphere of the bottom electrode 108. The nitrous oxide plasma treatment smooths a top surface of the interfacial layer 110. Further, the nitrous oxide plasma treatment passivates the native oxide, whereby the interfacial layer 110 blocks oxygen from diffusing to the bottom electrode 108 (e.g., from the insulator layer 112 or some other suitable source). This stops further oxidation of the bottom electrode 108, and hence further growth of the interfacial layer 110, after the nitrous oxide plasma treatment, whereby the thickness $T_{be}$ of the bottom electrode 108 may be more accurately controlled.

The top electrode 114 overlies the insulator layer 112 and is wholly formed by a crystalline top electrode structure (TES) 116. In other words, the top electrode 114 and the crystalline TES 116 are one and the same. In other embodiments, as seen hereafter, the crystalline TES 116 partially forms the top electrode 114.

The crystalline TES 116 has an orderly or semi-orderly arrangement of columnar crystalline grains 116g, which are vertically elongated. In some embodiments, the crystalline TES 116 additionally or alternatively has equiaxed crystalline grains (not shown). Because of the orderly or semi-orderly arrangement of the columnar crystalline grains 116g, a top surface 116t of the crystalline TES 116 may have high roughness. In embodiments, the high roughness is an average roughness (e.g., Ra) greater than about 0.7 nanometers or some other suitable value, or between about 0.7-0.8 nanometers or some other suitable value. In some embodiments, the crystalline TES 116 is as the crystalline BES 106 is described above.

The crystalline TES 116 is conductive and may, for example, be or comprise titanium nitride (e.g., TiN), tantalum nitride (e.g., TaN), some other suitable conductive material(s), or any combination of the foregoing. In some embodiments, the crystalline TES 116 is the same material as the crystalline BES 106 and/or the amorphous BES 104. For example, the crystalline BES 106, the crystalline TES 116, and the amorphous BES 104 may be or comprise titanium nitride or some other suitable material. In some embodiments, the crystalline TES 116 is a different material than the crystalline BES 106 and/or the amorphous BES 104.

In some embodiments, a thickness $T_{te}$ of the top electrode 114 is less than or equal to about 60 nanometers, about 50 nanometers, or some other suitable value, and/or is about 50-60 nanometers or some other suitable value. In some embodiments, the thickness $T_{te}$ of the top electrode 114 is the same as or substantially the same as that of the bottom electrode 108.

Figure 3:
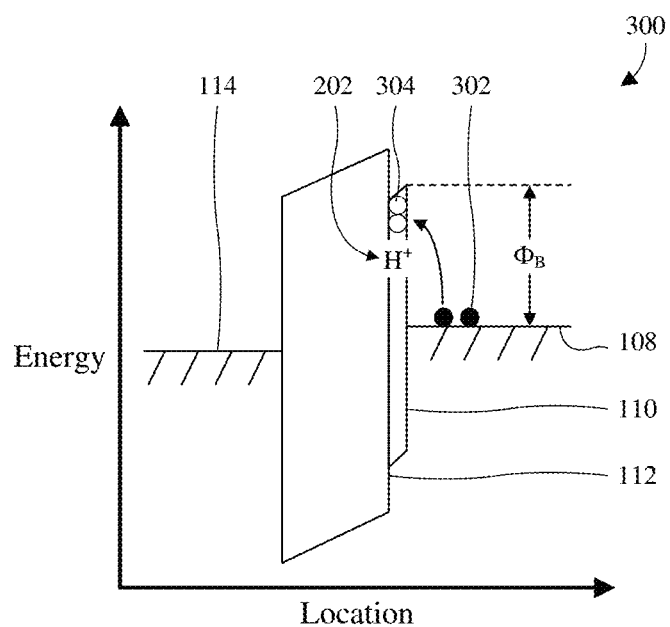
FIG. 3 illustrates an energy band diagram of some embodiments of the MIM capacitor of FIG. 1 while forward biased.

With reference to FIG. 3, an energy band diagram 300 of some embodiments of the MIM capacitor 102 of FIG. 1 while forward biased is provided. The MIM capacitor 102 may, for example, be forward biased when a voltage from the top electrode 114 to the bottom electrode 108 has a positive polarity. The vertical axis of the energy band diagram 300 corresponds to energy, and the horizontal axis of the energy band diagram 300 corresponds to location. From left to right, location changes from the top electrode 114 to the bottom electrode 108. The top electrode 114 and the bottom electrode 108 are schematically illustrated by the corresponding fermi levels, and the insulator layer 112 and the interfacial layer 110 are schematically illustrated by corresponding band gaps.

While the MIM capacitor 102 is forward biased, electrons 302 may tunnel through the insulator layer 112 by electron hopping at the interfacial layer 110. When a barrier height ØB of the interfacial layer 110 decreases, electron tunneling increases. When the barrier height ØB increases, electron tunneling decreases.

As described above, a hydrogen gas HPA may be performed during manufacture of an IC chip in which the MIM capacitor 102 is arranged. Hydrogen ions (e.g., H+) 202 from the hydrogen gas HPA may diffuse to an interface between the bottom electrode 108 and the insulator layer 112 and may cause localized hydrogen reduction reactions. The localized hydrogen reduction reactions form acceptor-like traps 304 that trap hydrogen ions 202 at the interfacial layer 110. The trapped hydrogen ions 202, in turn, reduce a barrier height ØB of the interfacial layer 110 and facilitate electron hopping.

Because the bottom electrode 108 comprises the amorphous BES 104 (see, e.g., FIG. 1) and hence has a top surface with a small roughness, surface area of the top surface is small. Because of the small top surface area, the amount of localized hydrogen reduction reactions is small and hence the amount of acceptor-like traps is small. Because of the small amount of acceptor-like traps, accumulation of hydrogen ions 202 at the interfacial layer 110 is low. Because of the low accumulation, the effect of hydrogen ions 202 on the barrier height ØB may be low and hence the barrier height ØB may be high. Therefore, electron tunneling may be low, leakage current may be low, breakdown voltage may be high, and TDDB may be high.

While not illustrated, the MIM capacitor 102 may also be reverse biased, whereby a voltage from the top electrode 114 to the bottom electrode 108 may have a negative polarity. When reverse biased, the electrons 302 may tunnel through the insulator layer 112 along oxygen vacancies formed in the insulator layer 112 by the localized hydrogen reduction reactions. However, because of the small top surface area at the top surface of the bottom electrode 108, the amount of localized hydrogen reduction reactions is small and hence the amount of oxygen vacancies is small. Because of the small amount of oxygen vacancies, leakage current may be low, breakdown voltage may be high, and TDDB may be high.

With reference to FIGS. 4A-4G, cross-sectional views 400A-400G of some alternative embodiments of the MIM capacitor of FIG. 1 are provided.

Figure 4A:
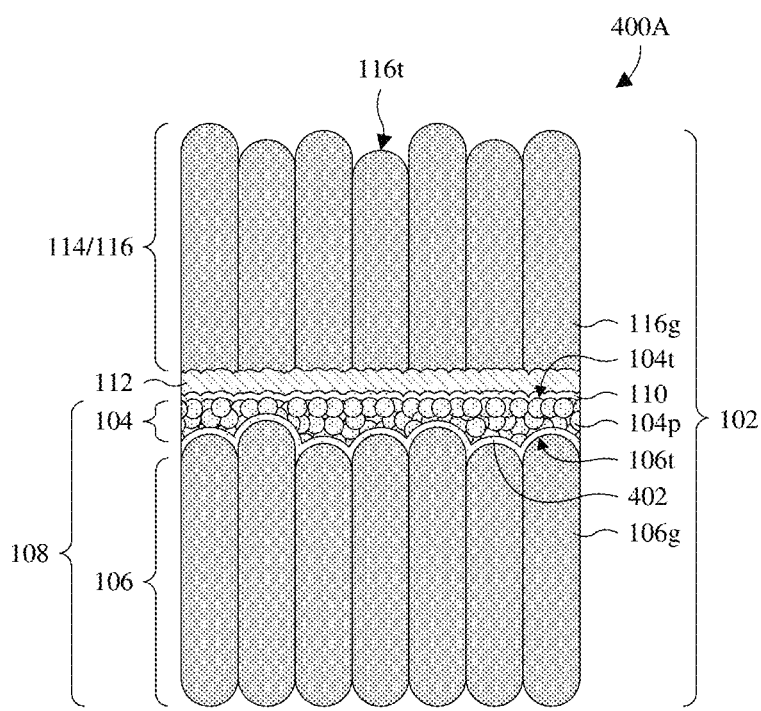
FIGS. 4A-4G illustrate cross-sectional views of some alternative embodiments of the MIM capacitor of FIG. 1.

In FIG. 4A, the bottom electrode 108 includes a bottom electrode interfacial layer 402 between the crystalline BES 106 and the amorphous BES 104. The bottom electrode interfacial layer 402 is oxide formed by oxidation of the crystalline BES 106. In some embodiments, the bottom electrode interfacial layer 402 is native oxide of the crystalline BES 106. In some embodiments, the crystalline BES 106 oxidizes in response to oxygen from an ambient atmosphere of the crystalline BES 106 before formation of the amorphous BES 104.

Figure 4B:
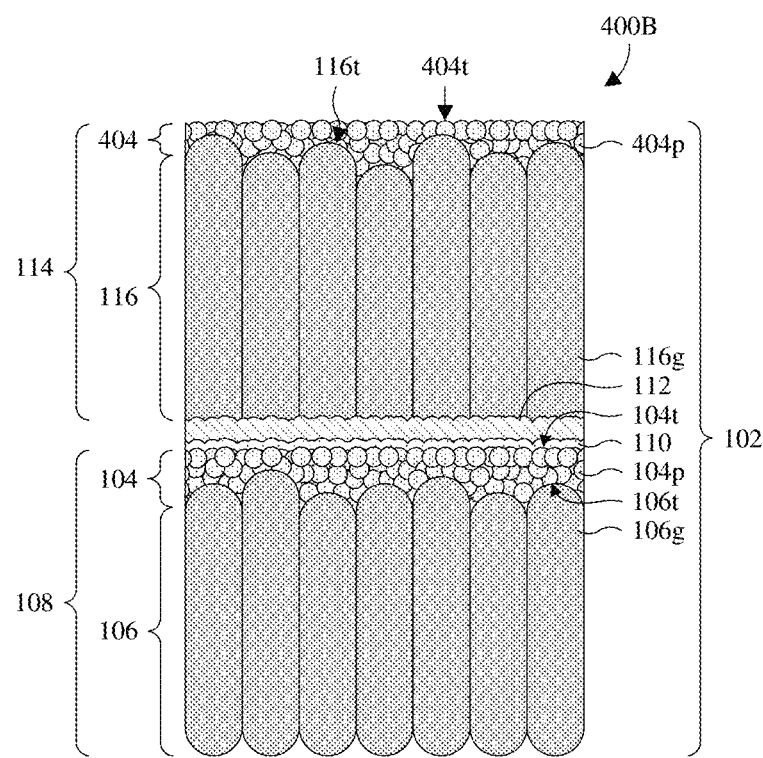

In FIG. 4B, the top electrode 114 comprises the crystalline TES 116 and an amorphous TES 404 overlying the crystalline TES 116. The amorphous TES 404 comprises a random or non-orderly arrangement of particles 404p. The particles 404p may, for example, be or comprise molecules, atoms, other suitable particle(s), or any combination of the foregoing. Because of the random or non-orderly arrangement, a top surface 404t of the amorphous TES 404 may have low roughness. The low roughness may, for example, reduce parasitic capacitance from the top electrode 114 to surrounding conductive features (not shown).

In embodiments, the low roughness is an average roughness (e.g., Ra) less than about 0.2 nanometers, 0.1 nanometers, or some other suitable value. In some embodiments, the low roughness is an average roughness less than that at the top surface 116t of the crystalline TES 116. In some embodiments, the low roughness is an average roughness within about 5%, 10%, or some other suitable percentage of an average roughness of the top surface 104t of the amorphous BES 104.

The amorphous and crystalline TESs 404, 116 are conductive and may, for example, be or comprise titanium nitride (e.g., TiN), tantalum nitride (e.g., TaN), some other suitable conductive material(s), or any combination of the foregoing. In some embodiments, the amorphous and crystalline TESs 404, 116 are the same material. In other embodiments, the amorphous and crystalline TESs 404, 116 are different materials. In some embodiments, the amorphous TES 404 and the amorphous BES 104 are the same material, and the crystalline TES 116 and the crystalline BES 106 are the same material. In other embodiments, the amorphous TES 404 and the amorphous BES 104 are different materials, and/or the crystalline TES 116 and the crystalline BES 106 are different materials.

Figure 4C:
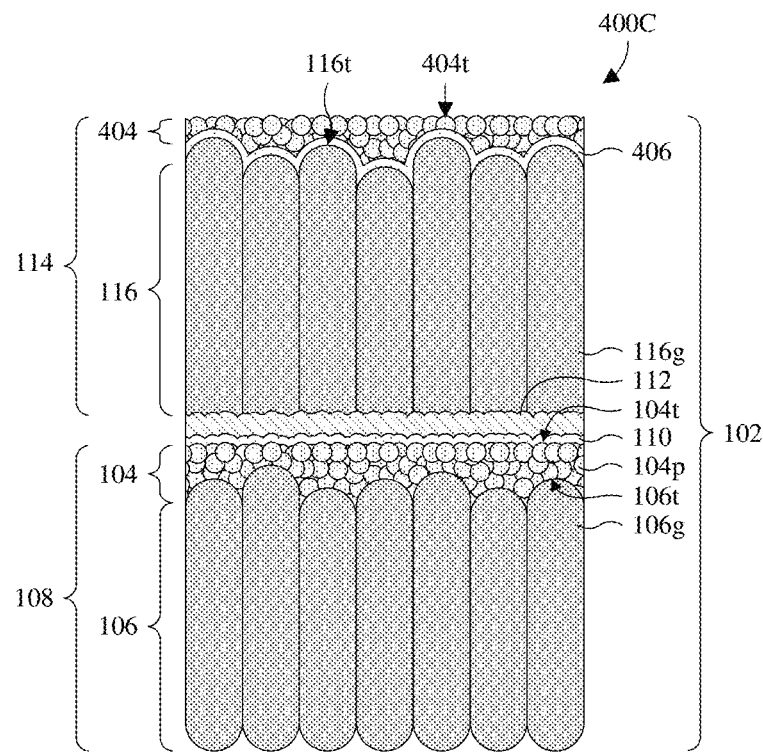

In FIG. 4C, the MIM capacitor 102 is as in FIG. 4B, except that the top electrode 114 further includes a top electrode interfacial layer 406 between the crystalline TES 116 and the amorphous TES 404. The top electrode interfacial layer 406 is oxide formed by oxidation of the crystalline TES 116. In some embodiments, the top electrode interfacial layer 406 is native oxide of the crystalline TES 116. In some embodiments, the crystalline TES 116 oxidizes in response to oxygen from an ambient atmosphere of the crystalline TES 116 before formation of the amorphous TES 404.

Figure 4D:
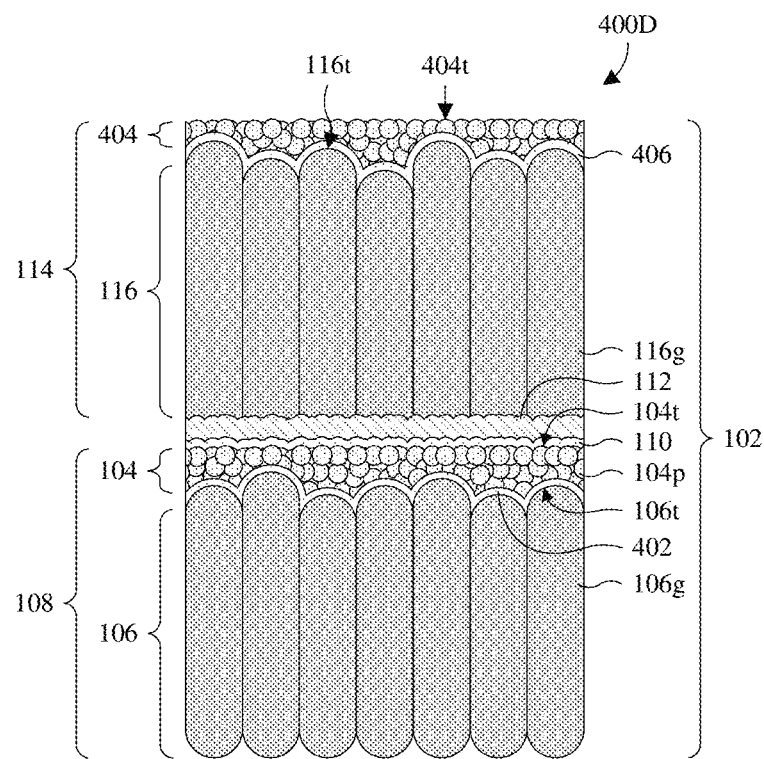

In FIG. 4D, the MIM capacitor 102 is as in FIG. 4C, except that the bottom electrode 108 further comprises the bottom electrode interfacial layer 402 as in FIG. 4A.

Figure 4E:
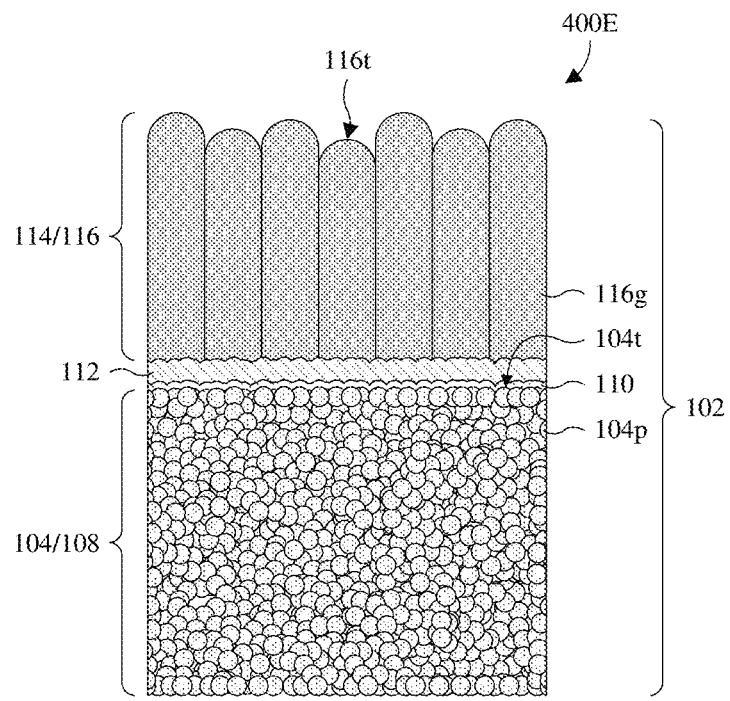

In FIG. 4E, the crystalline BES 106 is omitted. As such, the amorphous BES 104 wholly or substantially forms the bottom electrode 108.

Figure 4F:
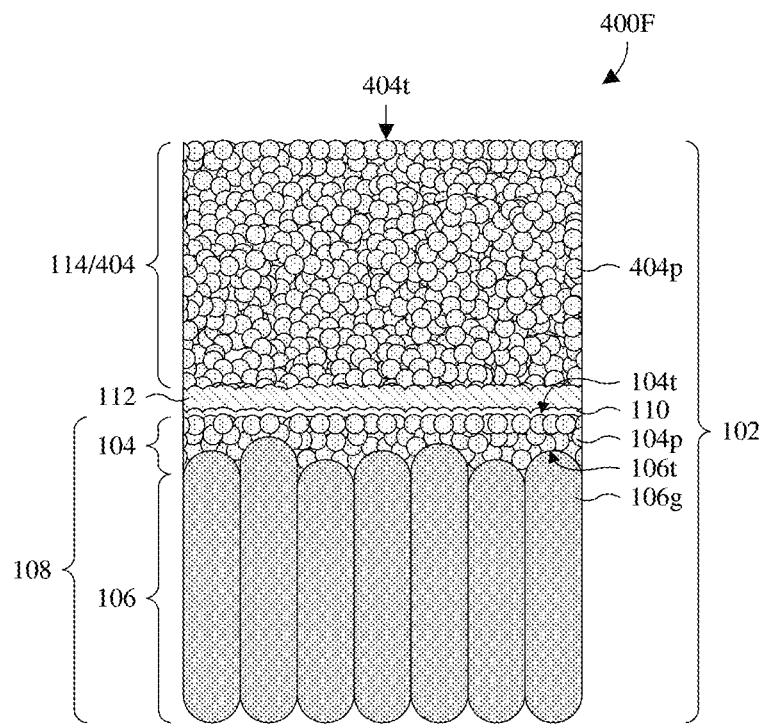

In FIG. 4F, the crystalline TES 116 is replaced with the amorphous TES 404 described with regard to FIG. 4B. As such, the amorphous TES 404 wholly or substantially forms the top electrode 114.

Figure 4G:
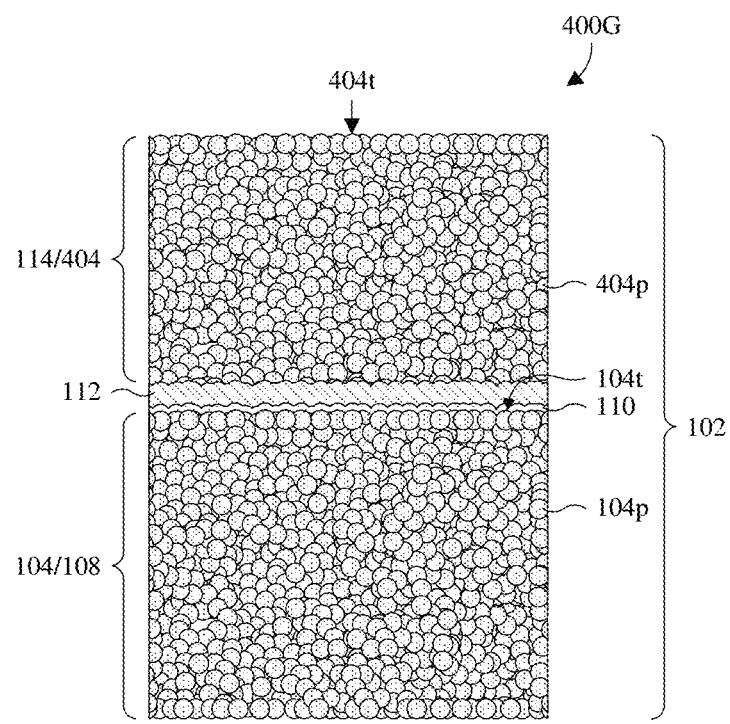

In FIG. 4G, the crystalline BES 106 is omitted, whereby the amorphous BES 104 wholly or substantially forms the bottom electrode 108. Further, the crystalline TES 116 is replaced with the amorphous TES 404 described with regard to FIG. 4B, whereby the amorphous TES 404 wholly or substantially forms the top electrode 114.

Figure 5:
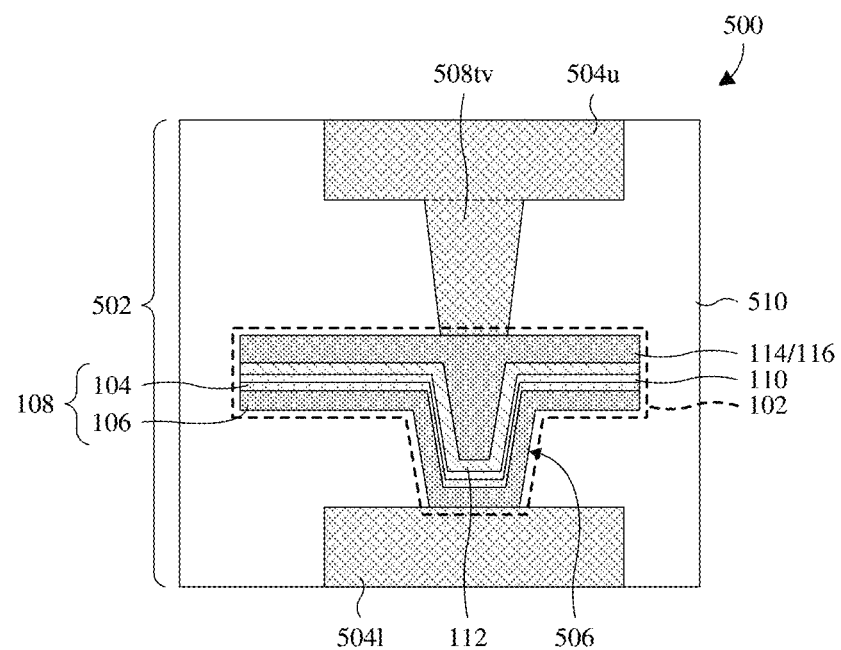
FIG. 5 illustrates a cross-sectional view of some embodiments of an integrated circuit (IC) chip in which a MIM capacitor comprising an amorphous BES is embedded in an interconnect structure.

With reference to FIG. 5, a cross-sectional view 500 of some embodiments of an IC chip is provided in which a MIM capacitor 102 comprising an amorphous BES 104 is embedded in an interconnect structure 502. The MIM capacitor 102 is as described with regard to FIG. 1. However, for case of illustration, the particles 104p in the amorphous BES 104, and the columnar crystalline grains 106g, 116g respectively in the crystalline BES 106 and the crystalline TES 116 are not shown.

The MIM capacitor 102 overlies a lower capacitor wire 504l and has a downward protrusion defining a bottom electrode via (BEVA) 506. An upper capacitor wire 504u overlies the MIM capacitor 102, and a top electrode via (TEVA) 508tv extends from the upper capacitor wire 504u to the MIM capacitor 102. The upper capacitor wire 504u and the TEVA 508tv are formed from a common layer but may be formed from separate layers in other embodiments. The lower capacitor wire 504l, the upper capacitor wire 504u, and the TEVA 508tv are conductive and may be or comprise, for example, aluminum copper, aluminum, copper, some other suitable metal(s), or any combination of the foregoing.

The MIM capacitor 102, the lower capacitor wire 504l, the upper capacitor wire 504u, and the TEVA 508tv are surrounded by an intermetal dielectric (IMD) layer 510. The IMD layer 510 may, for example, be or comprise a low k dielectric and/or some other suitable dielectric(s).

Figure 6A:
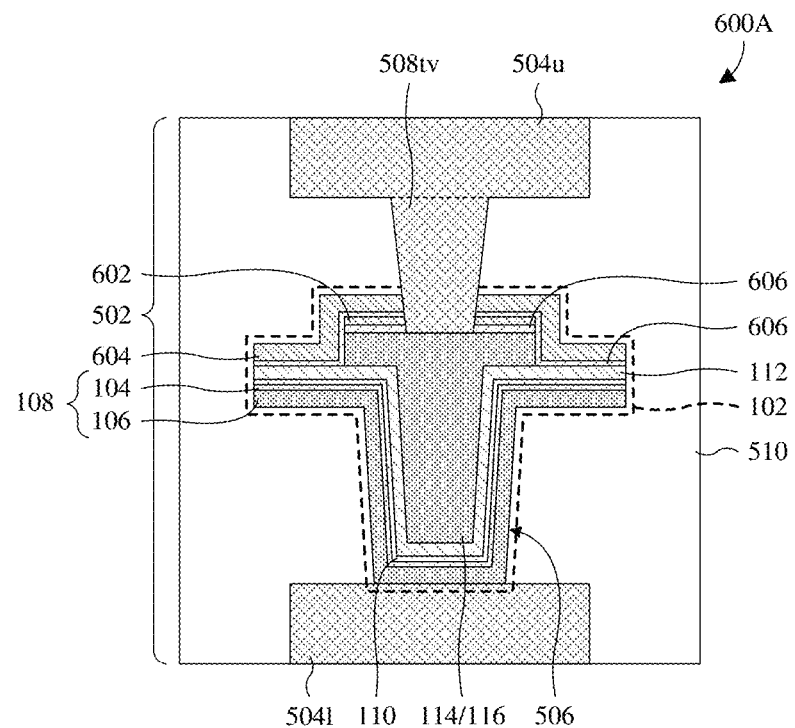
FIGS. 6A-6C illustrate cross-sectional views of some alternative embodiments of the IC chip of FIG. 5 in which a layout of the MIM capacitor is varied.
Figure 6B:
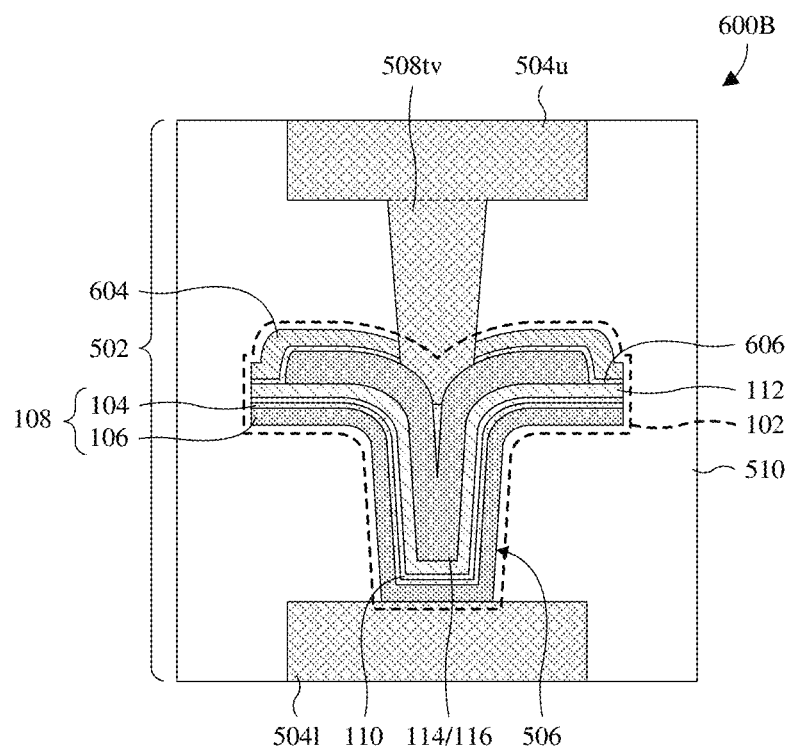
Figure 6C:
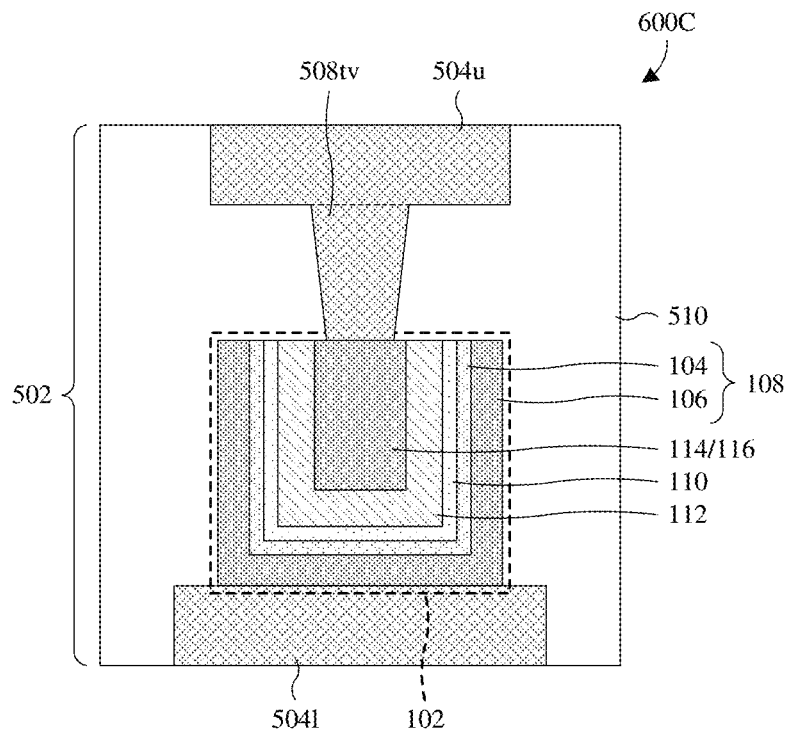

With reference to FIGS. 6A-6C, cross-sectional views 600A-600C of some alternative embodiments of the IC chip of FIG. 5 are provided.

In FIG. 6A, hard masks overlie the MIM capacitor 102 and the MIM capacitor 102 has a more symmetrical profile about a vertical axis at a width-wise center of the MIM capacitor 102. A top electrode hard mask 602 overlies the top electrode 114 with the same or substantially the same top layout as the top electrode 114. A bottom electrode hard mask 604 overlies the top electrode hard mask 602 and the bottom electrode 108 with the same or substantially the same top layout as the bottom electrode 108. The top and bottom electrode hard masks 602, 604 may be or comprise, for example, silicon nitride and/or some other suitable dielectric(s).

In some embodiments, a plurality of hard mask liners 606 individual to the top and bottom electrode hard masks 602, 604 separate the top and bottom electrode hard masks 602, 604 from the insulator layer 112 and the top electrode 114. The hard mask liners 606 are different materials than the top and bottom electrode hard masks 602, 604 and may be or comprise, for example, silicon oxide and/or some other suitable dielectric(s). In alternative embodiments, the hard mask liners 606 are omitted.

In FIG. 6B, the MIM capacitor 102 is as in FIG. 6A, except that a top of the top electrode 114 is indented at the BEVA 506. Further, the bottom electrode 108, the interfacial layer 110, the insulator layer 112, and the top electrode 114 have more curved edges, and the top electrode hard mask 602 and its corresponding hard mask liner 606 are omitted. In alternative embodiments, the top electrode hard mask 602 and its corresponding hard mask liner 606 remain on the top electrode 114 and separate the top electrode 114 from the bottom electrode hard mask 604 and its corresponding hard mask liner 606 as in FIG. 6A.

In FIG. 6C, the BEVA 506 is omitted. Further, the insulator layer 112 cups an underside of the top electrode 114, the interfacial layer 110 cups an underside of the insulator layer 112, and the bottom electrode 108 cups an underside of the interfacial layer 110. In some embodiments, the bottom electrode 108, the interfacial layer 110, the insulator layer 112, and the top electrode 114 have U or V shaped profiles. Other suitable profiles are, however, amenable.

Figure 7:
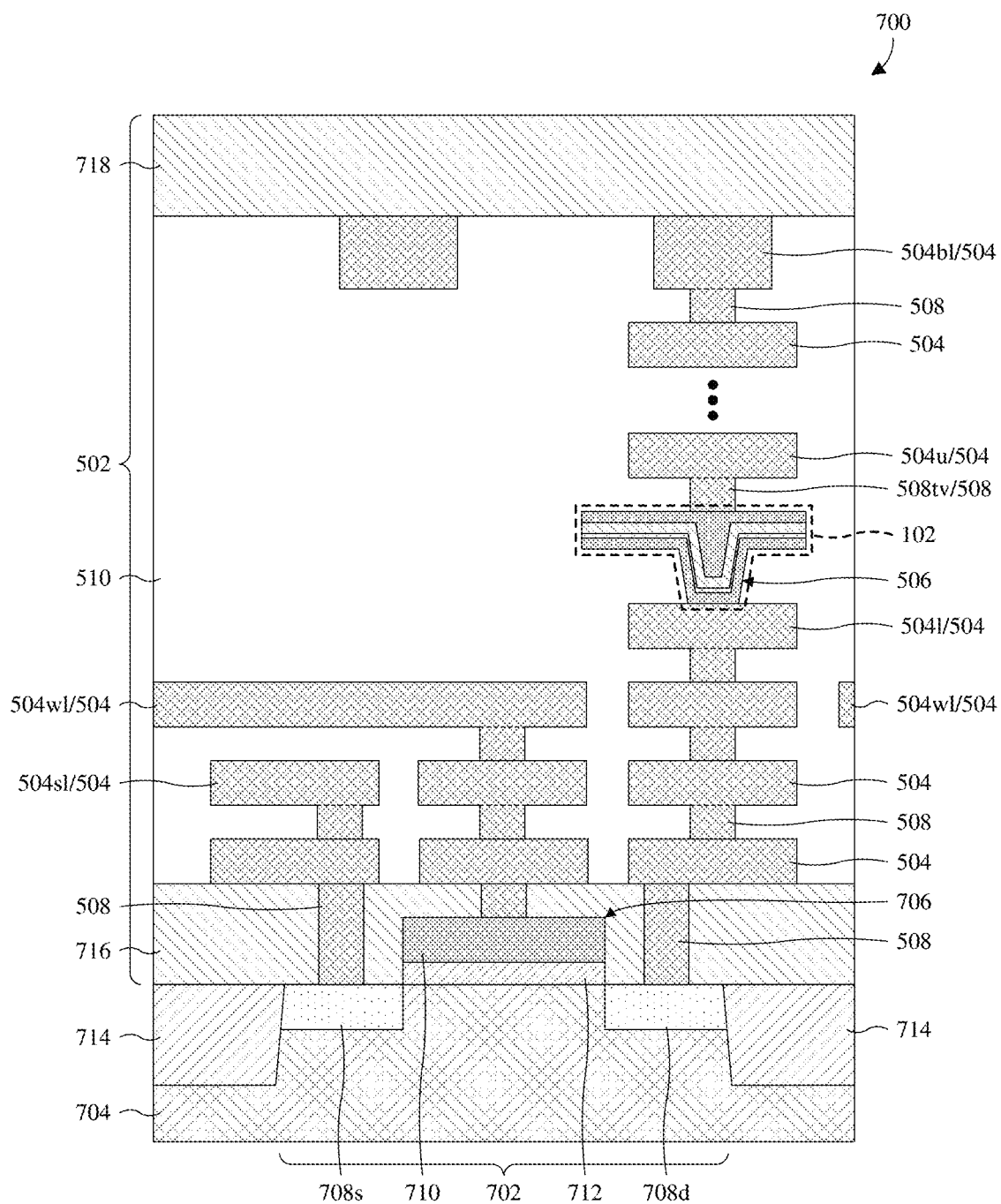
FIG. 7 illustrates a cross-sectional view of some embodiments of an IC chip in which the MIM capacitor of FIG. 5 is integrated into a one-transistor one-capacitor (1T1C) cell.

With reference to FIG. 7, a cross-sectional view 700 of some embodiments of an IC chip in which the MIM capacitor 102 of FIG. 5 is integrated into a one-transistor one-capacitor (1T1C) cell 702 is provided. The MIM capacitor 102 overlies a substrate 704 in an interconnect structure 502. The substrate 704 may be, for example, a bulk silicon substrate, silicon-on-insulator (SOI) substrate, or some other suitable semiconductor substrate.

The interconnect structure 502 comprises a plurality of wires 504 and a plurality of vias 508 respectively grouped into a plurality of wire levels and a plurality of via levels. The wire and via levels correspond to elevation above the substrate 704 and are alternatingly stacked. The wires 504 and the vias 508 are conductive and define conductive paths leading from the MIM capacitor 102 and an underlying access transistor 706. A first conductive path leads from the MIM capacitor 102 to a bit line 504bl above the MIM capacitor 102. A second conductive path leads from the MIM capacitor 102 to a drain region 708d of the access transistor 706. A third conductive path leads from a source region 708s of the access transistor 706 to a source line 504sl above the source region 708s. A fourth conductive path leads from a gate electrode 710 of the access transistor 706 to a word line 504wl above the gate electrode 710. Note that while the word line 504wl is shown with two separate segments on opposite sides of the drain region 708d, the word line 504wl may be continuous outside the cross-sectional view 700.

The access transistor 706 comprises the drain and source regions 708d, 708s, and further comprises the gate electrode 710 and a gate dielectric layer 712. The drain and source regions 708d, 708s are in the substrate 704 and correspond to doped regions of the substrate 704. The gate electrode 710 overlies the gate dielectric layer 712 and is sandwiched between the drain and source regions 708d, 708s. In some embodiments, the access transistor 706 is surrounded by a trench isolation structure 714, which extends into the substrate 704 and is or comprises dielectric material(s). The access transistor 706 may, for example, be an insulated gate field-effect transistor (IGFET) or some other suitable transistor.

An interlayer dielectric (ILD) layer 716, an IMD layer 510, and a passivation layer 718 are stacked over the substrate 704 and the access transistor 706. The IMD layer 510 overlies the ILD layer 716, and the passivation layer 718 overlies the IMD layer 510. The ILD layer 716 surrounds vias in a via level closest to the substrate 704, whereas the IMD layer 510 surrounds the wires 504 and vias in remaining via levels. The vias in the via level closest to the substrate 704 may also be referred to as contact vias or contacts.

The ILD layer 716 may, for example, be or comprise silicon oxide and/or some other suitable dielectric(s). The passivation layer 718 may, for example, be or comprise silicon oxide, silicon nitride, some other suitable dielectric(s), or any combination of the foregoing. In some embodiments, the IMD layer 510 is a different material than the ILD layer 716 at a first interface with the ILD layer 716, and/or is a different material than the passivation layer 718 at a second interface with the passivation layer 718.

While the MIM capacitor 102 in the IC chip of FIG. 7 is shown as being between the fourth and fifth wire levels, the MIM capacitor 102 may be between any other neighboring wire levels in alternative embodiments. Further, while the MIM capacitor 102 in the IC chip of FIG. 7 is shown as being in the IMD layer 510, the MIM capacitor 102 may be in the passivation layer 718 or the ILD layer 716 in alternative embodiments. While the MIM capacitor 102 in the IC chip of FIG. 7 is configured as in FIG. 5, the MIM capacitor 102 may alternatively be configured as in any of FIGS. 6A-6C. While the MIM capacitors 102 in the IC chips of FIGS. 5, 6A-6C, and 7 are configured according to embodiments of the MIM capacitor 102 in FIG. 1, the MIM capacitors 102 in the IC chips of FIGS. 5, 6A-6C, and 7 may alternatively be configured according to embodiments of the MIM capacitor 102 in any of FIGS. 4A-4G.

Figure 8:
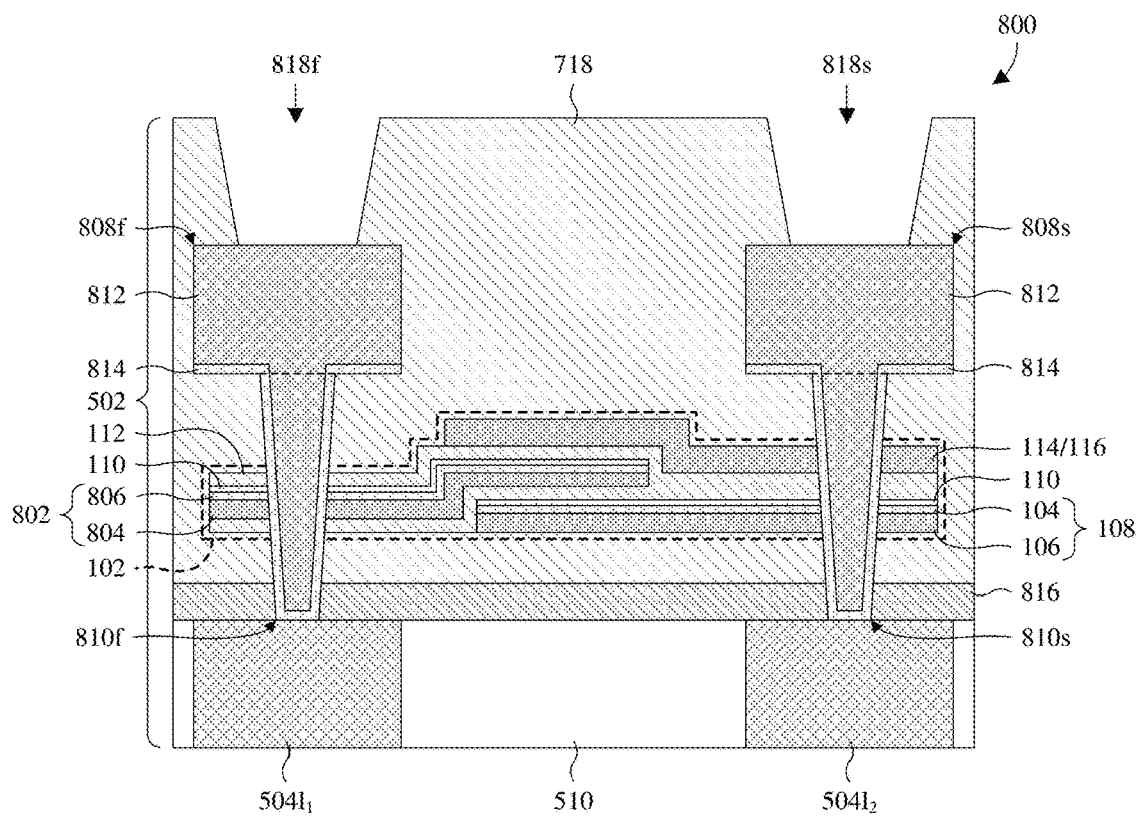
FIG. 8 illustrates a cross-sectional view of some embodiments of an IC chip in which a MIM capacitor comprising an amorphous BES and an amorphous MES is embedded in an interconnect structure.

With reference to FIG. 8, a cross-sectional view 800 of some embodiments of an IC chip in which a MIM capacitor 102 comprising a top electrode 114, a middle electrode 802, and a bottom electrode 108 is provided. The middle electrode 802 overlies the bottom electrode 108, and the top electrode 114 overlies the middle electrode 802. Further, an insulator layer 112 and interfacial layer 110 separate the top, middle, and bottom electrodes 114, 802, 108 from each other. The insulator layer 112 is as described with regard to FIG. 1, and the interfacial layers 110 are as their counterpart is described with regard to FIG. 1.

The top electrode 114 comprises a crystalline TES 116, which is as described with regard to FIG. 1. In some embodiments, the crystalline TES 116 wholly forms the top electrode 114. In other embodiments, the crystalline TES 116 partially forms the top electrode 114. FIG. 4B provides an example of such other embodiments. The bottom electrode 108 comprises a crystalline BES 106 and an amorphous BES 104 overlying the crystalline BES 106. Similarly, the middle electrode 802 comprises a crystalline middle electrode structure (MES) 804 and an amorphous MES 806 overlying the crystalline MES 804. The crystalline BES 106 is as described with regard to FIG. 1, and the crystalline MES 804 is as the crystalline BES 106 is described with regard to FIG. 1. The amorphous BES 104 is described with regard to FIG. 1, and the amorphous MES 806 is as the amorphous BES 104 is described with regard to FIG. 1. For ease of illustration, particles (e.g., 104p in FIG. 1) in the amorphous BES 104 and the amorphous MES 806, and columnar crystalline grains (e.g., 106g and 116g in FIG. 1) in the crystalline BES 106, the crystalline TES 116, and the crystalline MES 804, are not shown.

The MIM capacitor 102 underlies a first pad 808f and a second pad 808s, and further overlies a first lower capacitor wire 504$l_1$ and a second lower capacitor wire 504$l_2$. A first pad via 810f extends from the first pad 808f, through the middle electrode 802, to the first lower capacitor wire 504$l_1$. Further, a second pad via 810s extends from the second pad 808s, through the bottom and top electrodes 108, 114, to the second lower capacitor wire 504$l_2$.

The first segments respectively of a pad layer 812 and a liner layer 814 form the first pad via 810f and the first pad 808f, and second segments respectively of the pad layer 812 and the liner layer 814 form the second pad via 810s and the second pad 808s. The liner layer 814 is configured to block diffusion of material from the pad layer 812 and/or from the first and second lower capacitor wires 504$l_1$, 504$l_2$. The pad layer 812 may, for example, be or comprise aluminum copper, copper, aluminum, some other suitable conductive material(s), or any combination of the foregoing. The liner layer 814 may, for example, be or comprise titanium nitride, tantalum nitride, some other suitable material(s), or any combination of the foregoing.

An IMD layer 510 surrounds the first and second lower capacitor wires 504$l_1$, 504$l_2$. An etch stop layer 816 overlies the IMD layer 510 along the top of the first and second lower capacitor wires 504$l_1$, 504$l_2$, and a passivation layer 718 overlies the etch stop layer 816. The etch stop layer 816 and the passivation layer 718 surround the first and second pad vias 810f, 810s. Further, the passivation layer 718 surrounds the first and second pads 808f, 808s and forms a first pad opening 818f and a second pad opening 818s respectively overlying and exposing the first and second pads 808f, 808s. The etch stop layer 816 is a different material than the IMD layer 510 and the passivation layer 718 and may, for example, be or comprise silicon carbide and/or some other suitable dielectric(s).

The bottom and middle electrodes 108, 802 form a first capacitor, and the middle and top electrodes 802, 114 form a second capacitor. Because the bottom electrode 108 comprises the amorphous BES 104, breakdown voltage and TDDB of the first capacitor are high as described with regard to FIG. 1. Similarly, because the middle electrode 802 comprises the amorphous MES 806, breakdown voltage and TDDB of the second capacitor are high.

The first and second capacitors share the middle electrode 802, and the second pad via 810s electrically couples the bottom and top electrodes 108, 114 together. As such, the first and second capacitors are electrically coupled in parallel and form the MIM capacitor 102 with a total capacitance that is a sum of individual capacitances of the first and second capacitors. The first terminal of the MIM capacitor 102 corresponds to the first pad 808f, and a second terminal of the MIM capacitor 102 to the second pad 808s. Further, because the first and second capacitors share the middle electrode 802, capacitance density of the MIM capacitor 102 is high. In some embodiments, the MIM capacitor 102 is a super high-density MIM capacitor or some other suitable type of capacitor.

Figure 9:
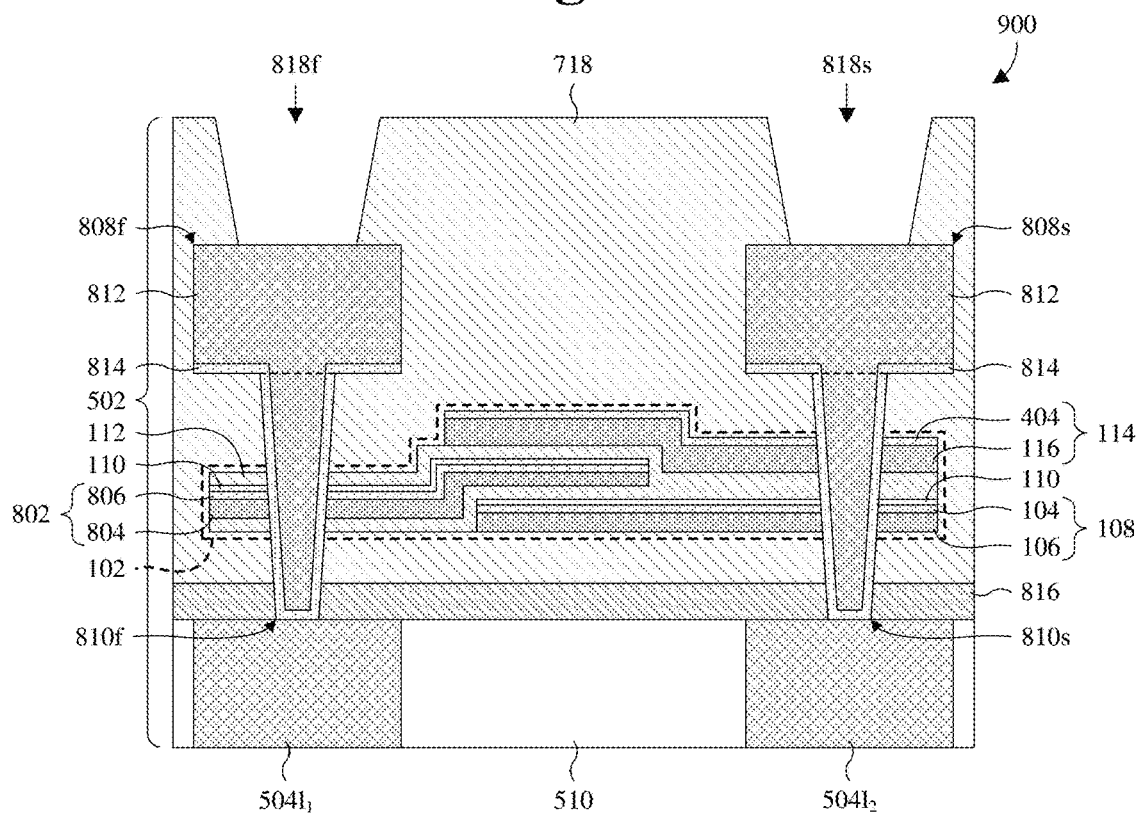
FIG. 9 illustrates a cross-sectional view of some alternative embodiments of the MIM capacitor of FIG. 8.

With reference to FIG. 9, a cross-sectional view 900 of some alternative embodiments of the MIM capacitor 102 of FIG. 8 is provided in which the top electrode 114 further comprises an amorphous TES 404 overlying the crystalline TES 116. As described with regard to FIG. 4B, the amorphous TES 404 may reduce parasitic capacitor from the top electrode 114 to surrounding conductive features. The surrounding conductive features may, for example, include the first and second pads 808f, 808s, the first and second pad vias 810f, 810s, other suitable conductive feature(s), or any combination of the foregoing.

Figure 10:
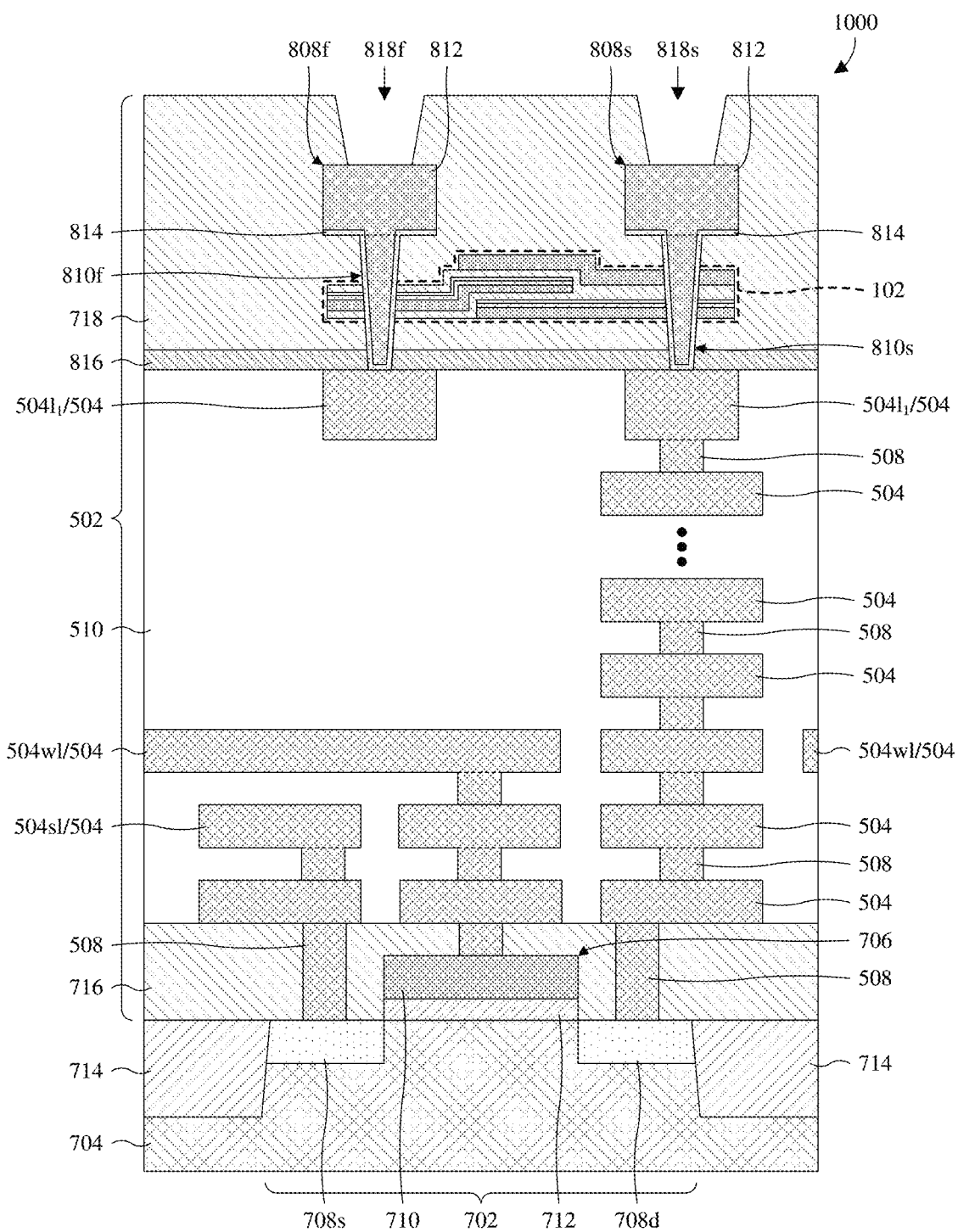
FIG. 10 illustrates a cross-sectional view of some embodiments of an IC chip in which the MIM capacitor of FIG. 8 is integrated into a 1T1C cell.

With reference to FIG. 10, a cross-sectional view 1000 of some embodiments of an IC chip in which the MIM capacitor 102 of FIG. 8 is integrated into a 1T1C cell 702 is provided. The 1T1C cell 702 may, for example, be as in FIG. 7, except for inclusion of the MIM capacitor 102 of FIG. 8 instead of the MIM capacitor of FIG. 5. In alternative embodiments of the IC chip, the MIM capacitor 102 of FIG. 8 is replaced with the MIM capacitor 102 of FIG. 9. Further, in alternative embodiments of the IC chip, the MIM capacitor 102 is in the IMD layer 510 or the ILD layer 716 instead of the passivation layer 718.

Figure 11:
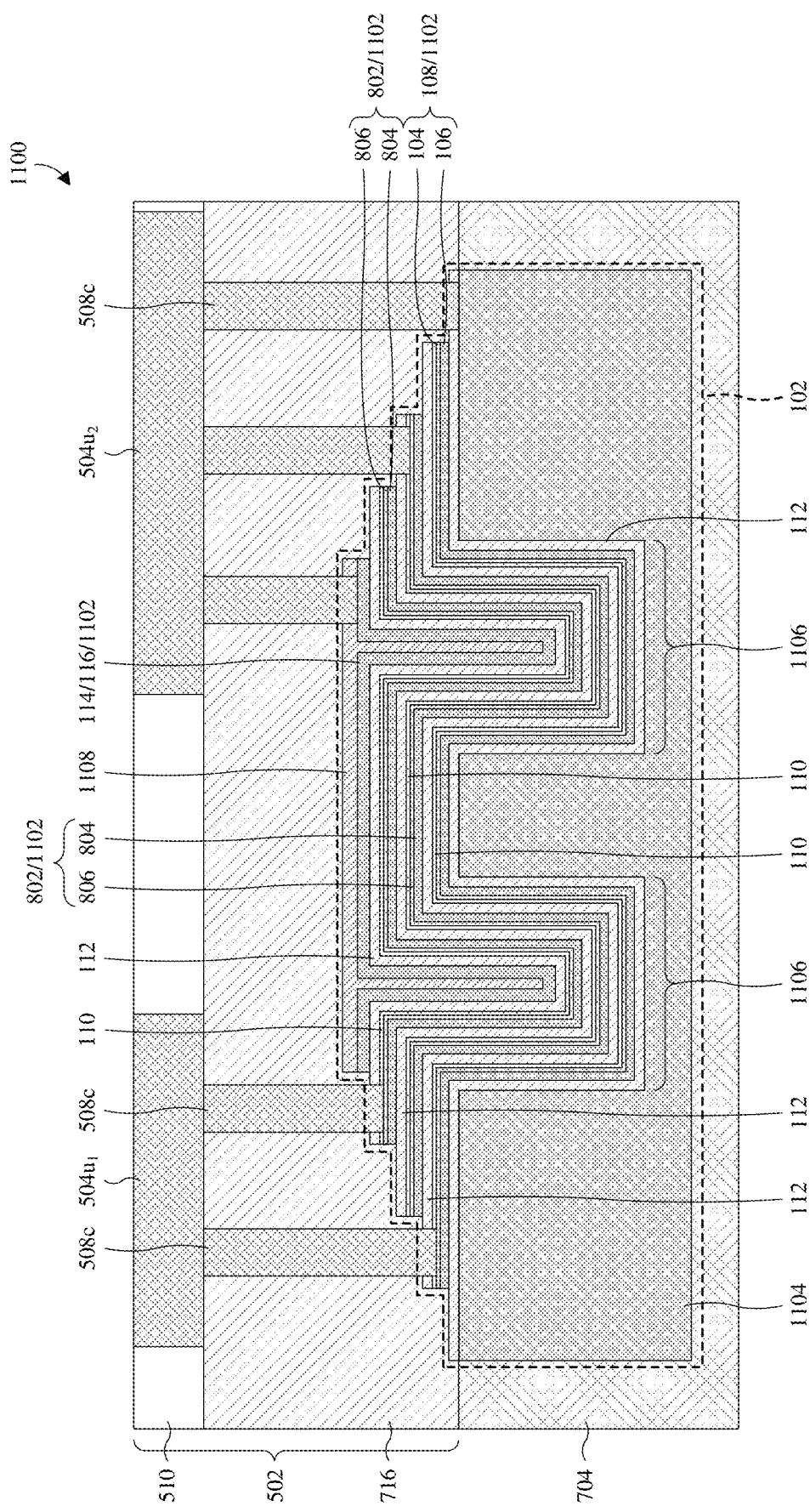
FIG. 11 illustrates a cross-sectional view of some embodiments of an IC chip in which a MIM capacitor comprising an amorphous BES and an amorphous MES is embedded in a substrate.

With reference to FIG. 11, a cross-sectional view 1100 of some embodiments of an IC chip in which a MIM capacitor 102 embedded in a substrate 704 is provided. The MIM capacitor 102 comprises a plurality of trench electrodes 1102 and a substrate electrode 1104. In alternative embodiments, the substrate electrode 1104 is omitted.

The trench electrodes 1102 form one or more trench segments 1106 protruding into the substrate 704, whereas the substrate electrode 1104 corresponds to a doped region of the substrate 704 that surrounds the trench segment(s) 1106. The trench electrodes 1102 overlie the substrate electrode 1104 and comprise a bottom electrode 108, a plurality of middle electrodes 802, and a top electrode 114 that are vertically stacked. Further, widths of the trench electrodes 1102 increase from a top of the vertical stack to a bottom of the vertical stack. The bottom, middle, and top electrodes 108, 802, 114 are respectively as their counterparts are described with regard to FIGS. 1 and 8. Hence, the bottom, middle, and top electrodes 108, 802, 114 comprise corresponding crystalline electrode structures 106, 804, 116, and the bottom and middle electrodes 108, 802 comprise corresponding amorphous electrode structures 104, 806.

A plurality of interfacial layers 110 and a plurality of insulator layers 112 are also stacked with the trench electrodes 1102 and the substrate electrode 1104. The insulator layers 112 separate the trench electrodes 1102 from each other and from the substrate electrode 1104. The insulator layers 112 may, for example, be as described with regard to FIG. 1. Except for the topmost one of the trench electrodes 1102, the trench electrodes 1102 have top surfaces covered respectively by the interfacial layers 110. The interfacial layers 110 may, for example, be as described with regard to FIG. 1. In some embodiments, the insulator layers 112 and/or the interfacial layers 110 each has a same top layout as an immediately underlying electrode (e.g., a substrate or trench electrode). In some embodiments, a cap layer 1108 overlies the topmost one of the trench electrodes 1102 and fills gaps at the trench segments 1106.

An interconnect structure 502 overlies and electrically couples to the MIM capacitor 102 and comprises a first upper capacitor wire 504u1 and a second upper capacitor wire 504u2. Further, the interconnect structure 502 comprises a plurality of capacitor vias 508c. The capacitor vias 508c electrically couple every other electrode of the MIM capacitor 102, from a bottom of the MIM capacitor 102 to a top of the MIM capacitor 102, to the second upper capacitor wire 504u2. Further, the capacitor vias 508c electrically couple remaining electrodes of the MIM capacitor 102 to the first upper capacitor wire 504u1. An ILD layer 716 surrounds the MIM capacitor 102 and the capacitor vias 508c, and an IMD layer 510 overlies the ILD layer 716 and surrounds the first and second upper capacitor wires 504u1, 504u2.

Similar to the MIM capacitor 102 of FIG. 8, the MIM capacitor 102 of FIG. 11 comprises multiple overlapping pairs of neighboring electrodes, which form individual capacitors. Further, the individual capacitors are electrically coupled in parallel by the interconnect structure 502. Because of the amorphous BES 104 and the amorphous MESs 806, breakdown voltage and TDDB of individual capacitors above the substrate electrode 1104 are high for the reasons described with regard to FIG. 1. Because of the parallel electrical coupling, the individual capacitors form the MIM capacitor 102 with a total capacitance that is a sum of individual capacitances of the individual capacitors. Because the multiple overlapping pairs of neighboring electrodes overlap, the individual capacitors share electrodes, whereby capacitance density of the MIM capacitor 102 is high.

While the bottom and top electrodes 108, 114 in the IC chips of FIGS. 8-11 are configured according to embodiments in FIG. 1, the bottom and top electrodes 108, 114 in the IC chips of FIGS. 8-11 may alternatively be configured according to embodiments in any of FIGS. 4A-4G. Further, while the one or more middle electrodes 802 in the IC chips of FIGS. 8-11 is/are configured according to embodiments of the bottom electrode 108 in FIG. 1, the middle electrode(s) 802 in the IC chips of FIGS. 8-11 may alternatively be configured according to embodiments of the bottom electrode 108 in any of FIGS. 4A-4G.

With reference to FIGS. 12-17, a series of cross-sectional views 1200-1700 of some embodiments of a method for forming a MIM capacitor comprising an amorphous BES is provided. The method may, for example, be employed to form the MIM capacitor 102 of FIG. 1 or some other suitable MIM capacitor.

Figure 12:
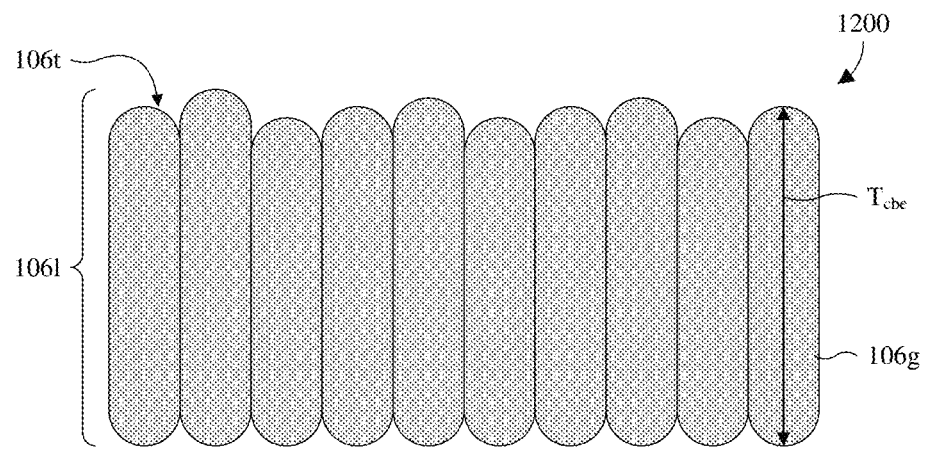
FIGS. 12-17 illustrate a series of cross-sectional views of some embodiments of a method for forming a MIM capacitor comprising an amorphous BES.

As illustrated by the cross-sectional view 1200 of FIG. 12, a crystalline bottom electrode layer (BEL) 106l is deposited on a substrate (not shown). The crystalline BEL 106l has an orderly or semi-orderly arrangement of columnar crystalline grains 106g, which are vertically elongated. In some embodiments, the crystalline BEL 106l additionally or alternatively has equiaxed crystalline grains (not shown). Because of the columnar crystalline grains 106g, the crystalline BEL 106l has a top surface 106t with high roughness. In embodiments, the high roughness is an average roughness (e.g., Ra) greater than or equal to about 0.7 nanometers, about 0.8 nanometers, or some other suitable value.

The crystalline BEL 106*l* is conductive and may, for example, be or comprise titanium nitride (e.g., TiN), tantalum nitride (e.g., TaN), some other suitable conductive material(s), or any combination of the foregoing. Further, the crystalline BEL 106*l* may, for example, be deposited by atomic layer deposition (ALD), physical vapor deposition (PVD), some other suitable deposition process(es), or any combination of the foregoing. In some embodiments, a thickness $T_{cbe}$ of the crystalline BEL 106*l* is less than or equal to about 57 nanometers, about 50 nanometers, about 40 nanometers, or some other suitable value, and/or is about 50-57 nanometers, about 40-50 nanometers, or some other suitable value.

Figure 13:
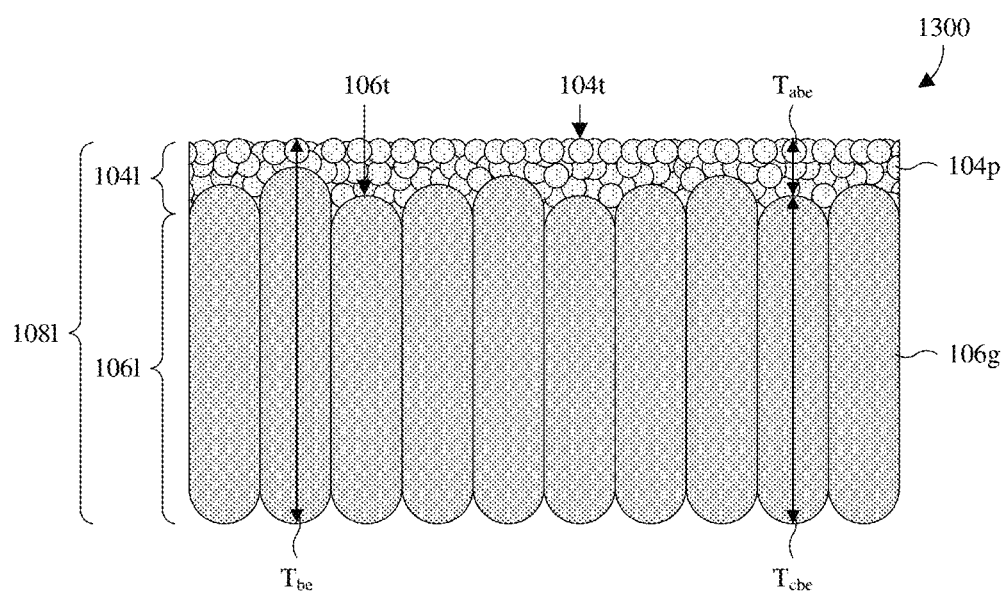

As illustrated by the cross-sectional view 1300 of FIG. 13, an amorphous BEL 104*l* is deposited overlying the crystalline BEL 106*l*. The amorphous BEL 104*l* comprises a random or non-orderly arrangement of particles 104*p*. The particles 104*p* may, for example, be or comprise molecules, atoms, other suitable particles, or any combination of the foregoing.

Because of the random or non-orderly arrangement, the amorphous BEL 104*l* has a top surface 104*t* with a low roughness compared to that at the top surface 106*t* of the crystalline BEL 106*l*. In embodiments, the low roughness is an average roughness (e.g., Ra) less than or equal to about 0.2 nanometers, 0.1 nanometers, or some other suitable value, and/or is about 0.1-0.2 nanometers or some other suitable value. As explained hereafter, if the roughness is too high (e.g., greater than about 0.2 nanometers), an insulator layer of the MIM capacitor being formed may have a low breakdown voltage and a low TDDB.

The amorphous BEL 104*l* is conductive and may, for example, be or comprise titanium nitride (e.g., TiN), tantalum nitride (e.g., TaN), some other suitable conductive material(s), or any combination of the foregoing. In some embodiments, the amorphous BEL 104*l* is the same material as the crystalline BEL 106*l*. In other embodiments, the amorphous BEL 104*l* is a different material than the crystalline BEL 106*l*.

The amorphous BEL 104*l* may, for example, be deposited by ALD, PVD, some other suitable deposition process(es), or any combination of the foregoing. In some embodiments, the amorphous BEL 104*l* and the crystalline BEL 106*l* are deposited by the same type of deposition process. For example, the amorphous BEL 104*l* and the crystalline BEL 106*l* may both be deposited by ALD, PVD, or some other suitable deposition process. In other embodiments, the amorphous BEL 104*l* and the crystalline BEL 106*l* are deposited by different deposition processes. For example, the amorphous BEL 104*l* may be deposited by ALD, whereas the crystalline BEL 106*l* may be deposited by PVD.

In some embodiments, the amorphous BEL 104*l* and the crystalline BEL 106*l* are deposited in a common process chamber. In other embodiments, the amorphous BEL 104*l* and the crystalline BEL 106*l* are deposited in separate process chambers. In at least some of such other embodiments, a bottom electrode interfacial layer (e.g., 402 in FIG. 4A) may be between the amorphous BEL 104*l* and the crystalline BEL 106*l* as in FIG. 4A.

In some embodiments, a thickness $T_{abe}$ of the amorphous BEL 104*l* is greater than or equal to about 3 nanometers, about 5 nanometers, or some other suitable value, and/or is about 3-5 nanometers, about 5-10 nanometers, or some other suitable value. If the thickness $T_{abe}$ is too small (e.g., less than about 3 nanometers), the amorphous BES 104 may be unable to fully fill recesses in the top surface 106*t* of the crystalline BEL 106*l*, whereby the top surface 104*t* of the amorphous BEL 104*l* may have a large roughness and an insulator layer hereafter formed on the amorphous BEL 104*l* may have a low breakdown voltage and a low TDDB. If the thickness $T_{abe}$ is too large (e.g., more than about 10 nanometers), manufacturing costs may be high and manufacturing throughput may low because deposition of amorphous material may be more costly and slower compared to deposition of crystalline material.

The amorphous BEL 104*l* and the crystalline BEL 106*l* form a BEL 108*l*, and the amorphous BEL 104*l* forms a top surface of the BEL 108*l*. If the amorphous BEL 104*l* was omitted, the crystalline BEL 106*l* would form the top surface of the BEL 108*l* and the top surface would have a high roughness. However, because the amorphous BEL 104*l* forms the top surface of the BEL 108*l*, the top surface has a low roughness. In alternative embodiments, the crystalline BEL 106*l* is not formed at FIG. 12, whereby the amorphous BEL 104*l* wholly or substantially forms the BEL 108*l*. For example, the amorphous BEL 104*l* and the BEL 108*l* may be one and the same. In some embodiments, the thickness of the BEL 108*l* is less than or about equal to about 60 nanometers, about 50 nanometers, or some other suitable value, and/or is about 50-60 nanometers or some other suitable value.

Figure 14:
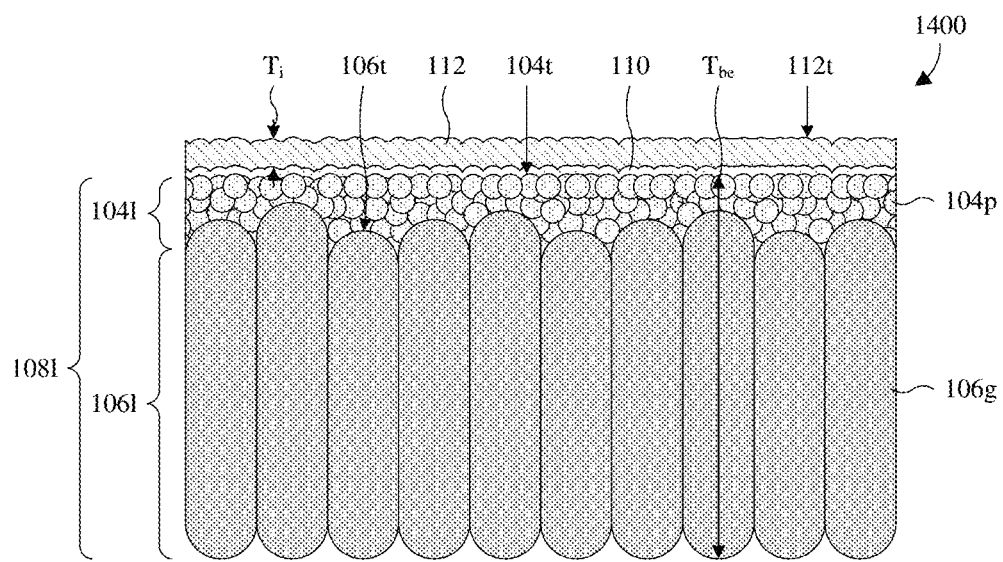

As illustrated by the cross-sectional view 1400 of FIG. 14, an insulator layer 112 is deposited overlying the BEL 108*l*. The insulator layer 112 is dielectric and may, for example, be or comprise zirconium oxide, aluminum oxide, hafnium oxide, silicon oxide, some other suitable dielectric(s), or any combination of the foregoing. In some embodiments, the insulator layer 112 is or comprises a metal oxide and/or is or comprises a high k dielectric. The insulator layer 112 may, for example, be deposited by ALD or some other suitable deposition process.

Because the top surface of the BEL 108*l* is formed by the top surface 104*t* of the amorphous BEL 104*l*, the top surface of the BEL 108*l* has low roughness. As such, the insulator layer 112 has a top surface 112*t* with low roughness, and further has a thickness $T_i$ that is uniform or substantially uniform. The low roughness of the insulator layer 112 may, for example, be as the low roughness of the amorphous BEL 104*l* is described above.

Between the depositing of the amorphous BEL 104*l* and the depositing of the insulator layer 112, and/or during the depositing of the insulator layer 112, an interfacial layer 110 may form at the top surface of the BEL 108*l*. In at least some embodiments, the interfacial layer 110 is oxide formed by oxidation of the BEL 108*l*. In some embodiments, the BEL 108*l* oxidizes in response to oxygen from the insulator layer 112, and/or oxygen from an ambient atmosphere of the BEL 108*l* before the depositing of the insulator layer 112. In some embodiments, the interfacial layer 110 is plasma treated before the depositing of the insulator layer 112. In other embodiments, the interfacial layer 110 is not plasma treated.

To the extent that the interfacial layer 110 is plasma treated, the interfacial layer 110 may, for example, be native oxide of the BEL 108*l* plasma treated with plasma formed from nitrogen oxide gas. Other suitable gas(es) is/are, however, amenable in other embodiments. The native oxide may, for example, be formed by reaction of the BEL 108*l* with oxygen in an ambient atmosphere of the BEL 108*l*. The nitrogen oxide plasma treatment smooths the top surface of the BEL 108*l*. Further, the nitrogen oxide plasma treatment passivates the native oxide, whereby the interfacial layer 110 blocks oxygen from diffusing to the BEL 108*l*. This stops further oxidation of the BEL 108*l*, and hence further growth of the interfacial layer 110, whereby the thickness $T_{be}$ of the BEL 108*l* may be more accurately controlled.

Figure 15:
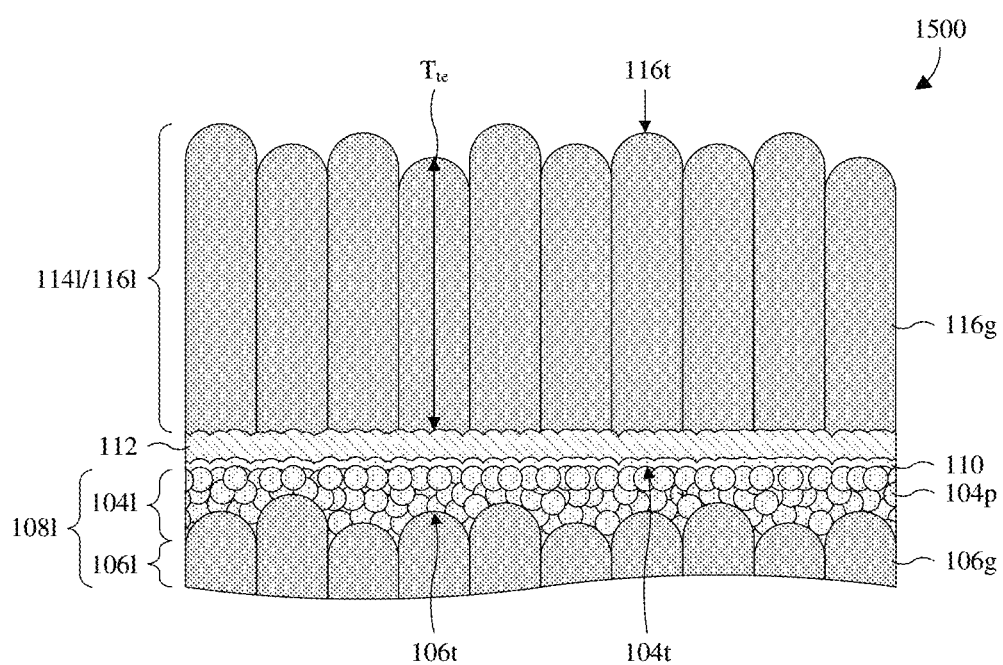

As illustrated by the cross-sectional view 1500 of FIG. 15, a crystalline top electrode layer (TEL) 116l is deposited on the insulator layer 112. Note that a lower portion of the crystalline BEL 106l is omitted herein and hereafter for drawing compactness. The crystalline TEL 116l has an orderly or semi-orderly arrangement of columnar crystalline grains 116g, which are vertically elongated. In some embodiments, the crystalline TEL 116l additionally or alternatively has equiaxed crystalline grains (not shown).

Because of the columnar crystalline grains 116g, the crystalline TEL 116l has a top surface 116t with a high roughness. In embodiments, the high roughness is an average roughness (e.g., Ra) greater than or equal to about 0.7 nanometers or some other suitable value, or between about 0.7-0.8 nanometers or some other suitable value. In some embodiments, the high roughness is average roughness and is greater than average roughness at the top surface 104t of the amorphous BEL 104l. In some embodiments, the high roughness is average roughness and is within about 5%, 10%, or some other suitable percentage of average roughness at the top surface 106t of the crystalline BEL 106l.

The crystalline TEL 116l is conductive and may, for example, be or comprise titanium nitride (e.g., TiN), tantalum nitride (e.g., TaN), some other suitable conductive material(s), or any combination of the foregoing. In some embodiments, the crystalline TEL 116l is a same material as the crystalline BEL 106l and/or the amorphous BEL 104l. Further, the crystalline TEL 116l may, for example, be deposited by ALD, PVD, some other suitable deposition process(es), or any combination of the foregoing. In some embodiments, the crystalline TEL 116l is deposited by the same deposition process as the crystalline BEL 106l and/or the amorphous BEL 104l. For example, the crystalline TEL 116l and the crystalline BEL 106l may be deposited by PVD, and the amorphous BEL 104l may be deposited by ALD.

The crystalline TEL 116l wholly or substantially forms a TEL 114l. For example, the TEL 114l and the crystalline TEL 116l may be one and the same. Accordingly, deposition of the crystalline TEL 116l may be regarded as deposition of the TEL 114l. In alternative embodiments, an amorphous TEL is deposited on the crystalline TEL 116l, and the crystalline TEL 116l and the amorphous TEL collectively form the TEL 114l. The amorphous TEL may, for example, be deposited as described for the amorphous BEL 104l with regard to FIG. 13.

In some embodiments, a thickness $T_{te}$ of the TEL 114l is equal to or less than about 60 nanometers, about 57 nanometers, about 50 nanometers, or some other suitable value, and/or is about 50-60 nanometers, about 50-57 nanometers, or some other suitable value. In some embodiments, the thickness $T_{te}$ of the TEL 114l is within about 5%, 10%, or some other suitable percentage of the thickness $T_{be}$ of the BEL 108l (see, e.g., FIG. 14).

Figure 16:
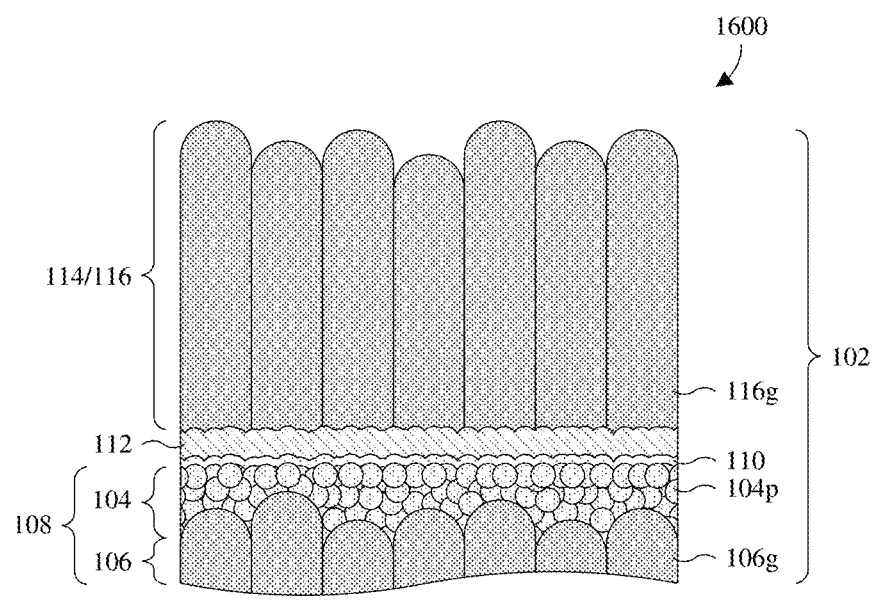

As illustrated by the cross-sectional view 1600 of FIG. 16, the BEL 108l (see, e.g., FIG. 15), the TEL 114l (see, e.g., FIG. 15), the insulator layer 112, and the interfacial layer 110 are patterned to form a MIM capacitor 102. Such patterning may, for example, be performed by or comprise a series of one or more photolithography/etching processes and/or other suitable process(es). The MIM capacitor 102 comprises a bottom electrode 108, a portion of the interfacial layer 110, a portion of the insulator layer 112, and a top electrode 114.

The bottom electrode 108 is formed from the BEL 108l and comprises an amorphous BES 104 and a crystalline BES 106. The amorphous and crystalline BESs 104, 106 are respectively formed from the amorphous BEL 104l (see, e.g., FIG. 15) and the crystalline BEL 106l (see, e.g., FIG. 15). The top electrode 114 is formed from the TEL 114l and comprises a crystalline TES 116 formed from the crystalline TEL 116l (see, e.g., FIG. 15). As noted above, the TEL 114l and the crystalline TEL 116l may, for example, be one and the same, whereby the top electrode 114 and the crystalline TES 116 may, for example, be one and the same. Further, as noted above, the TEL 114l may further comprise an amorphous TEL overlying the crystalline TEL 116l in alternative embodiments. In such alternative embodiments, the top electrode 114 comprises an amorphous TES overlying the crystalline TES as seen in, for example, FIG. 4B.

Figure 17:
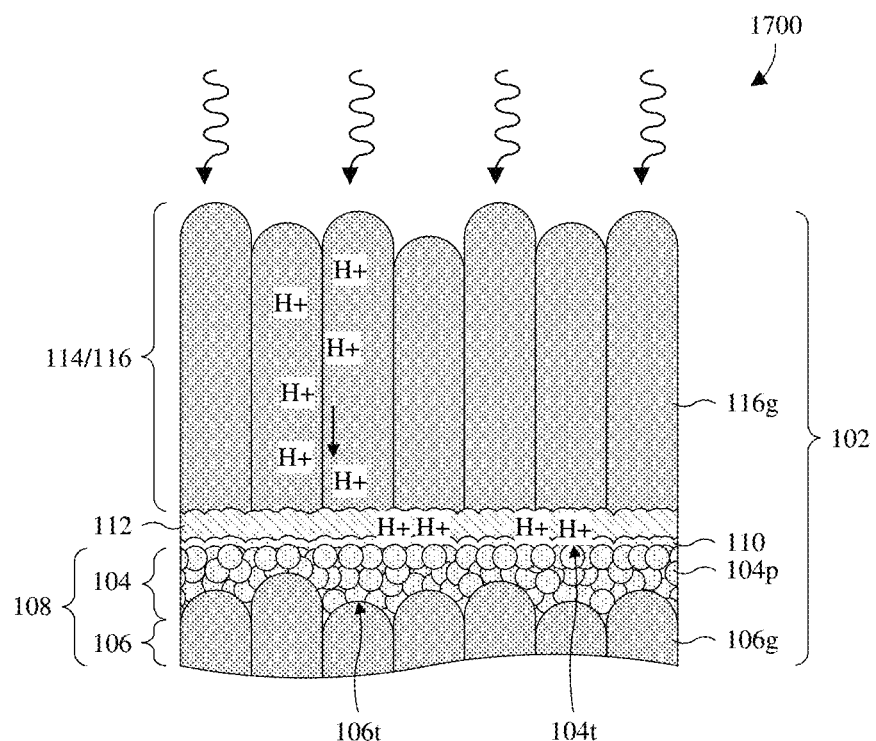

As illustrated by the cross-sectional view 1700 of FIG. 17, a hydrogen gas HPA is performed after forming the MIM capacitor 102. The hydrogen gas HPA may, for example, be performed at a temperature that is greater than about 200 degrees Celsius, about 420 degrees Celsius, or some other suitable temperature, and/or may, for example, be performed at a pressure that is about 20 atmospheres and/or some other suitable value. Further, the hydrogen gas HPA may, for example, be performed for about 260 minutes, about 200-300 minutes, or some other suitable amount of time.

During the hydrogen gas HPA, hydrogen ions (e.g., H+) 202 may diffuse through the top electrode 114 and the insulator layer 112 to an interface between the bottom electrode 108 and the insulator layer 112. At the interface, the hydrogen ions 202 may cause the bottom electrode 108 and the insulator layer 112 to undergo localized hydrogen reduction reactions. The localized hydrogen reduction reactions may form acceptor-like traps at the interfacial layer 110. Further, the localized hydrogen reduction reactions may change a stoichiometry of the insulator layer 112 and may form oxygen vacancies at the insulator layer 112.

Because the top surface 104t of the amorphous BES 104, instead of the top surface 106t of the crystalline BES 106, forms the top surface of the bottom electrode 108, the top surface of the bottom electrode 108 has a small roughness. Because of the small roughness at the top surface of the bottom electrode 108, surface area at the top surface, and hence at the interface between the bottom electrode 108 and the insulator layer 112, may be small. Because of the small surface area, a small amount of localized hydrogen reduction reactions may result. Because of the small amount of localized hydrogen reduction reactions, a small amount of acceptor-like traps may form at the interfacial layer 110 and a small amount of oxygen vacancies may form at the insulator layer 112.

The acceptor-like traps trap the hydrogen ions 202, which decreases a barrier height of the interfacial layer 110 and increases electron hopping through the insulator layer 112. Hence, the acceptor-like traps increase leakage current through the insulator layer 112, decrease a TDDB of the insulator layer 112, and decrease a breakdown voltage of the insulator layer 112. However, because there may be a small amount of acceptor-like traps, the acceptor-like traps may have a small effect on the barrier height. Hence, electron hopping may be low, leakage current may be low, TDDB may be high, and breakdown voltage may be high.

The oxygen vacancies provide leakage paths to increase leakage current through the insulator layer 112. Hence, the oxygen vacancies decrease a TDDB of the insulator layer 112 and decrease a breakdown voltage of the insulator layer 112. However, because there may be a small amount of oxygen vacancies, the oxygen vacancies have a small effect on leakage current. Hence, TDDB may be high and breakdown voltage may be high.

While FIGS. 12-17 are described with reference to a method, it will be appreciated that the structures shown in FIGS. 12-17 are not limited to the method but rather may stand alone separate of the method. While FIGS. 12-17 are described as a series of acts, it will be appreciated that the order of the acts may be altered in other embodiments. While FIGS. 12-17 illustrate and describe as a specific set of acts, some acts that are illustrated and/or described may be omitted in other embodiments. Further, acts that are not illustrated and/or described may be included in other embodiments.

Figure 18:
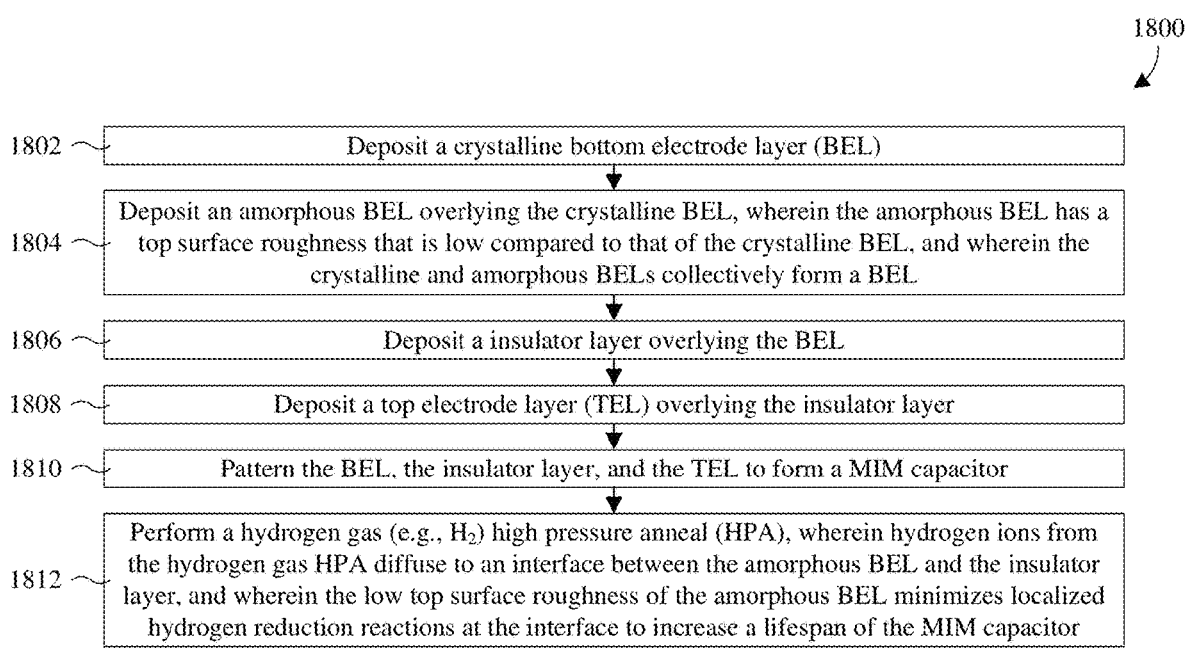
FIG. 18 illustrates a block diagram of some embodiments of the method of FIGS. 12-17.

With reference to FIG. 18, a block diagram 1800 of some embodiments of the method of FIGS. 12-17 is provided.

At 1802, a crystalline BEL is deposited. See, for example, FIG. 12.

At 1804, an amorphous BEL is deposited overlying the crystalline BEL, wherein the amorphous BEL has a top surface roughness that is low compared to that of the crystalline BEL, and wherein the crystalline and amorphous BELs collectively form a BEL. See, for example, FIG. 13.

At 1806, an insulator layer is deposited overlying the BEL. See, for example, FIG. 14. At 1808, a TEL is deposited overlying the insulator layer. See, for example, FIG. 15.

At 1810, the BEL, the insulator layer, and the TEL are patterned to form a MIM capacitor. See, for example, FIG. 16.

At 1812, a hydrogen gas (e.g., $H_2$) high pressure anneal (HPA) is performed, wherein hydrogen ions from the hydrogen gas HPA diffuse to an interface between the amorphous BEL and the insulator layer, and wherein the low top surface roughness of the amorphous BEL minimizes localized hydrogen reduction reactions at the interface to increase a lifespan of the MIM capacitor. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 19-30, a series of cross-sectional views 1900-3000 of some embodiments of a method for forming an IC chip is provided in which in which a MIM capacitor comprising an amorphous BES and an amorphous MES is embedded in an interconnect structure. The method may, for example, be employed to form the IC chip of FIG. 10 or some other suitable IC chip.

Figure 19:
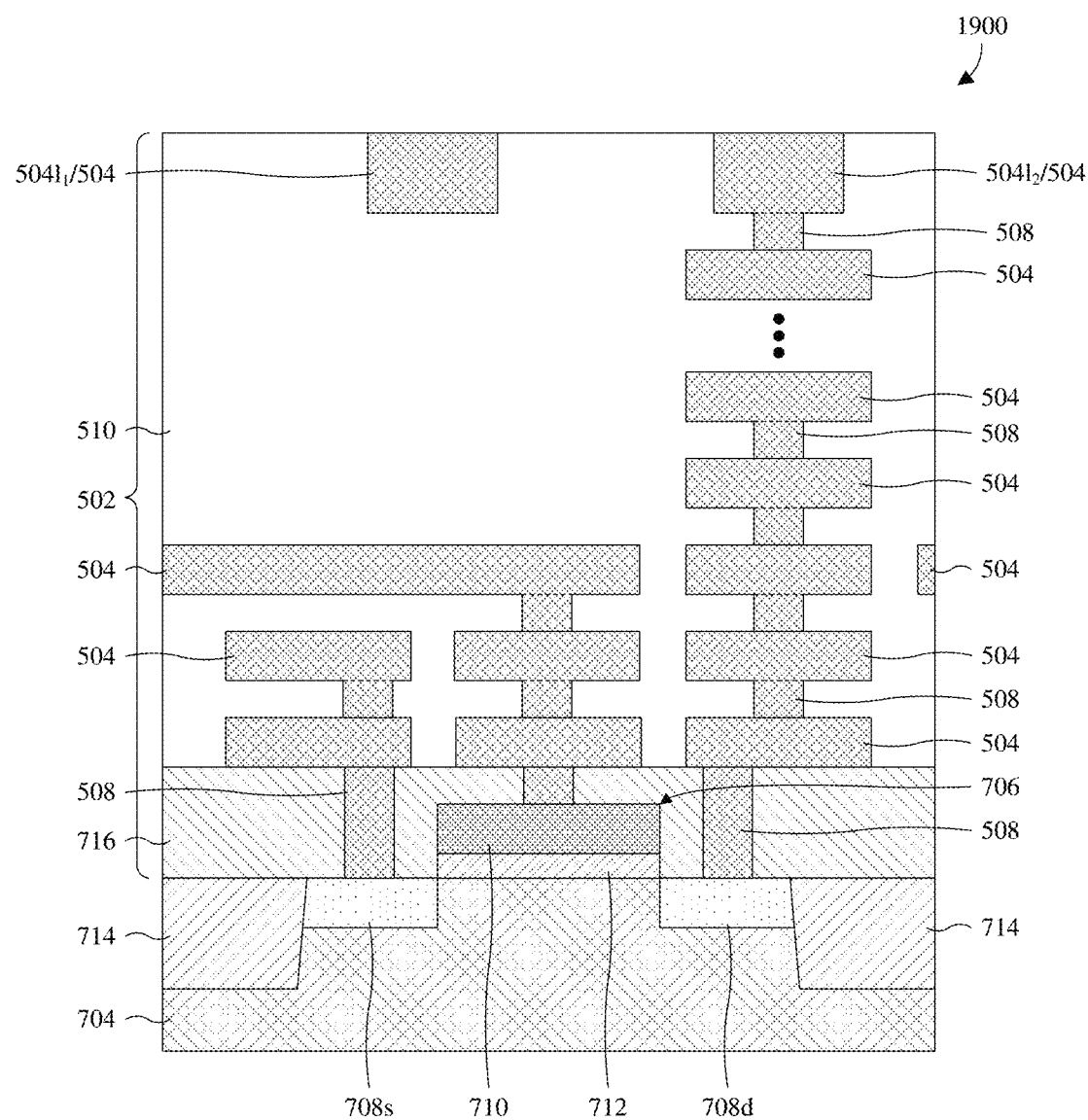
FIGS. 19-30 illustrate a series of cross-sectional views of some embodiments of a method for forming an IC chip in which a MIM capacitor comprising an amorphous BES and an amorphous MES is embedded in an interconnect structure.

As illustrated by the cross-sectional view 1900 of FIG. 19, an access transistor 706 and a trench isolation structure 714 are formed on a substrate 704. The access transistor 706 is isolated from neighboring devices (not shown) on the substrate 704 by the trench isolation structure 714, which extends into the substrate 704. Further, an interconnect structure 502 is partially formed covering and electrically coupled to the access transistor 706.

The interconnect structure 502 is embedded in an ILD layer 716 and an IMD layer 510. The interconnect structure 502 comprises a plurality of wires 504 and a plurality of vias 508 stacked to define conductive paths leading from the access transistor 706. The plurality of wires 504 comprises a first lower capacitor wire $504l_1$ and a second lower capacitor wire $504l_2$ at a top of the interconnect structure 502, and the second lower capacitor wire $504l_2$ is electrically coupled the access transistor 706 by the interconnect structure 502. The access transistor 706, the trench isolation structure 714, the substrate 704, the interconnect structure 502, the ILD layer 716, and the IMD layer 510 are as described with regard to FIG. 10.

Figure 20:
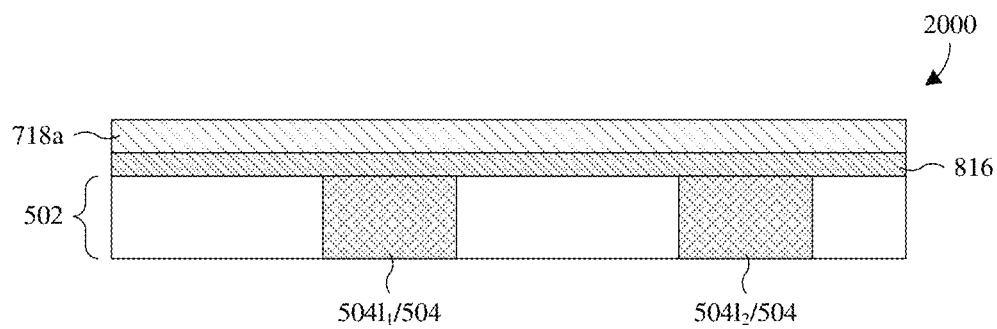

As illustrated by the cross-sectional view 2000 of FIG. 20, an etch stop layer 816 and a first passivation layer 718a are deposited over the interconnect structure 502. For drawing compactness, structure underlying the first and second lower capacitor wire $504l_1$, $504l_2$ is herein and hereafter omitted. However, it is to be appreciated that said structure is as in FIG. 19.

Figure 21:
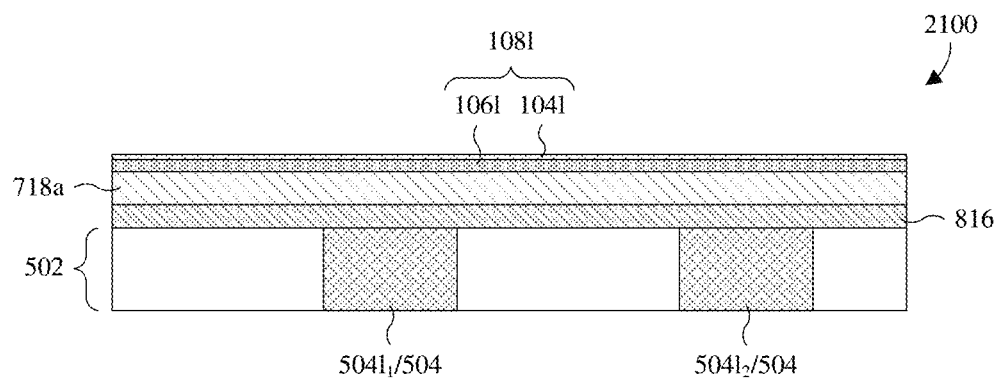

As illustrated by the cross-sectional view 2100 of FIG. 21, a BEL 108l is deposited as described with regard to FIGS. 12 and 13. The BEL 108l comprises a crystalline BEL 106l and an amorphous BEL 104l overlying the crystalline BEL 106l. The crystalline BEL 106l is, and is deposited, as described with regard to FIG. 12, and the amorphous BEL 104l is, and is deposited, as described with regard to FIG. 13. In alternative embodiments, the crystalline BEL 106l is omitted such that the amorphous BEL 104l wholly or substantially forms the BEL 108l.

Figure 22:
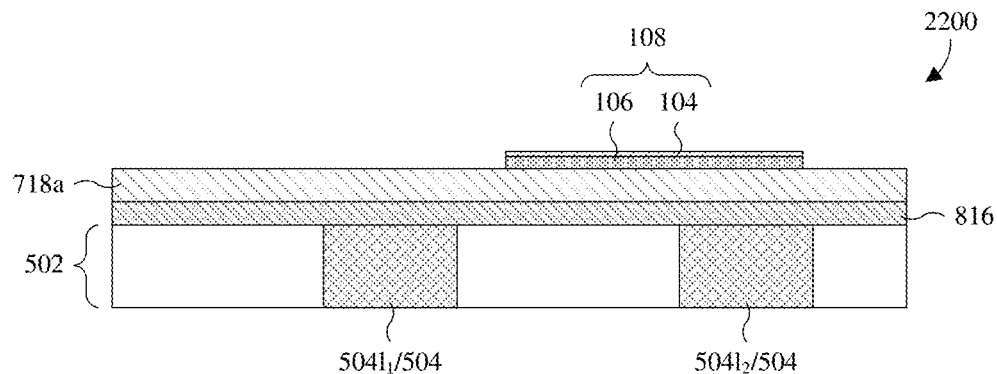

As illustrated by the cross-sectional view 2200 of FIG. 22, the BEL 108l (see, e.g., FIG. 21) is patterned to form a bottom electrode 108. The bottom electrode 108 comprises a crystalline BES 106 formed from the crystalline BEL 106l (see, e.g., FIG. 21), and further comprises an amorphous BES 104 overlying the crystalline BES 106 and formed from the amorphous BEL 104l (see, e.g., FIG. 21). The patterning may, for example, be performed by a photolithography/etching process and/or some other suitable process(es).

Figure 23:
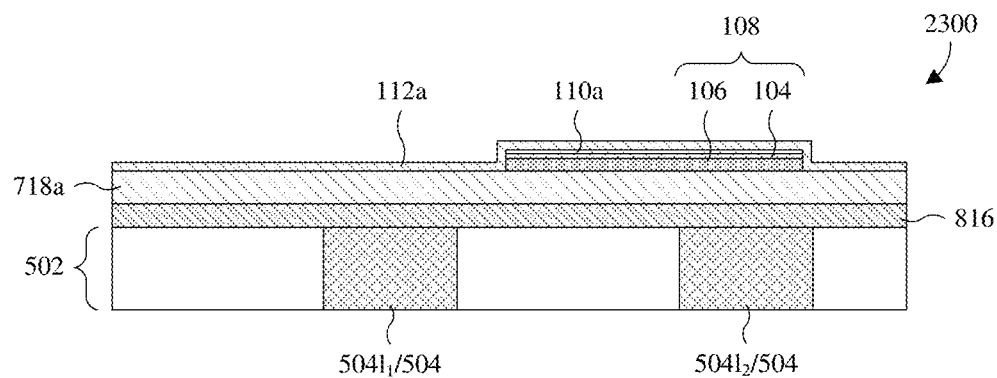

As illustrated by the cross-sectional view 2300 of FIG. 23, a first insulator layer 112a is deposited covering the first passivation layer 718a and the bottom electrode 108. Further, between the depositing of the amorphous BEL 104l at FIG. 21 and the depositing of the first insulator layer 112a at FIG. 23, and/or during the depositing of the first insulator layer 112a at FIG. 23, a first interfacial layer 110a may form at the top surface of the bottom electrode 108. The first insulator layer 112a and the first interfacial layer 110a are, and are formed, as described respectively for the insulator layer 112 and the interfacial layer 110 with regard to FIG. 14.

Figure 24:
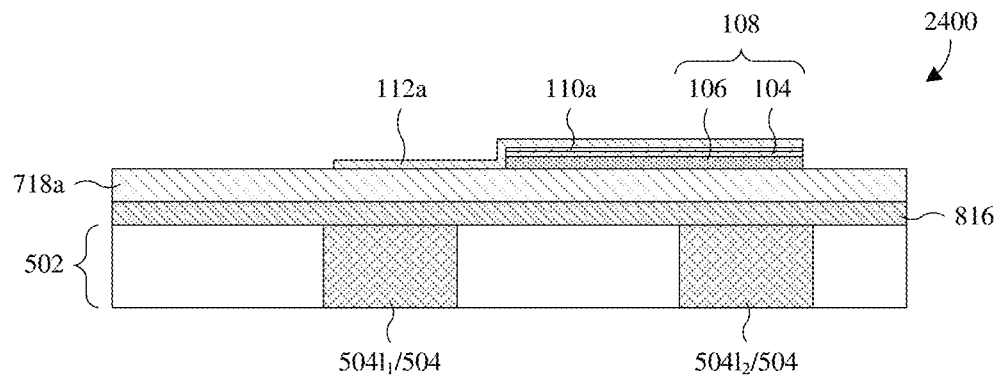

As illustrated by the cross-sectional view 2400 of FIG. 24, the first insulator layer 112a is patterned to delineate a portion of the first insulator layer 112a individual to the MIM capacitor being formed and to separate the portion from any remainder (not shown) of the first insulator layer 112a. The patterning may, for example, be performed by a photolithography/etching process or some other suitable patterning process.

Figure 25:
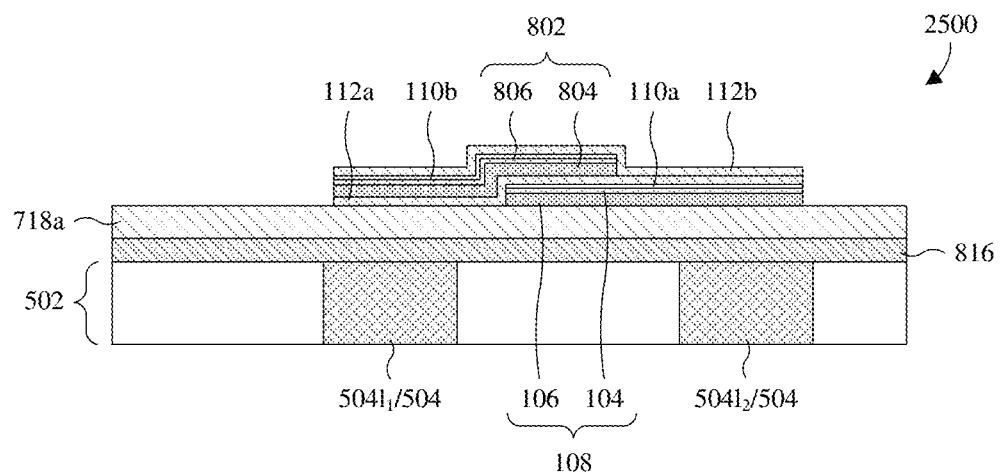

As illustrated by the cross-sectional view 2500 of FIG. 25, the acts described with regard to FIGS. 21-24 are repeated to form a middle electrode 802 and a second insulator layer 112b. The middle electrode 802 is formed by the acts described with regard to FIGS. 21 and 22, whereby the middle electrode 802 is as the bottom electrode 108 is described and is formed by the same process used to form the bottom electrode 108. The middle electrode 802 comprises a crystalline MES 804 and an amorphous MES 806 overlying the crystalline MES 804. The second insulator layer 112b is formed by the acts described with regard to FIGS. 23 and 24, whereby the second insulator layer 112b is as the first insulator layer 112a is described and is hence formed by the same process used to form the first insulator layer 112a.

While repeating the acts described with regard to FIGS. 21-24, a second interfacial layer 110b forms between the middle electrode 802 and the second insulator layer 112b. The second interfacial layer 110b is as the first interfacial layer 110a is described and forms as described for the first interfacial layer 110a.

Figure 26:
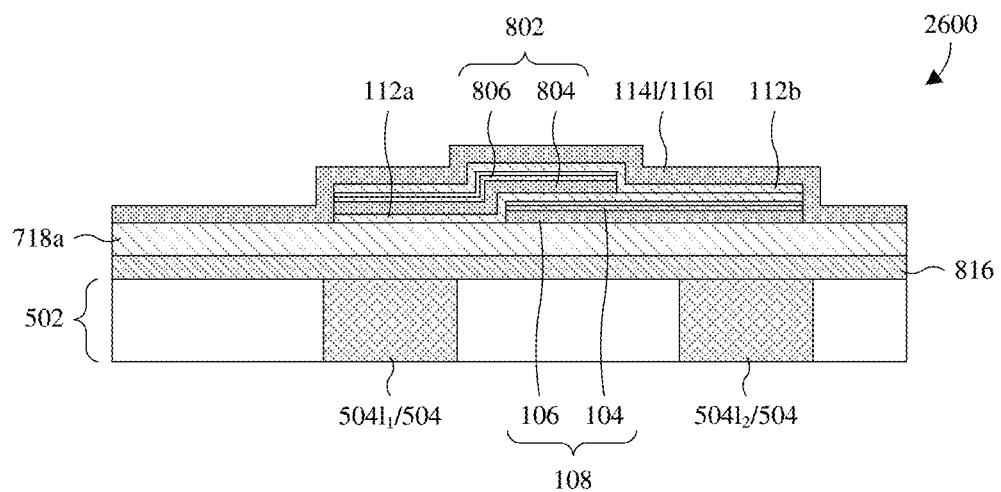

As illustrated by the cross-sectional view 2600 of FIG. 26, a crystalline TEL 116l is deposited overlying the second insulator layer 112b. The crystalline TEL 116l is, and is deposited, as described with regard to FIG. 15. As above, the crystalline TEL 116l forms a TEL 114l. In alternative embodiments, an amorphous TEL is deposited on the crystalline TEL 116l, whereby the crystalline TEL 116l and the amorphous TEL collectively form the TEL 114l.

Figure 27:
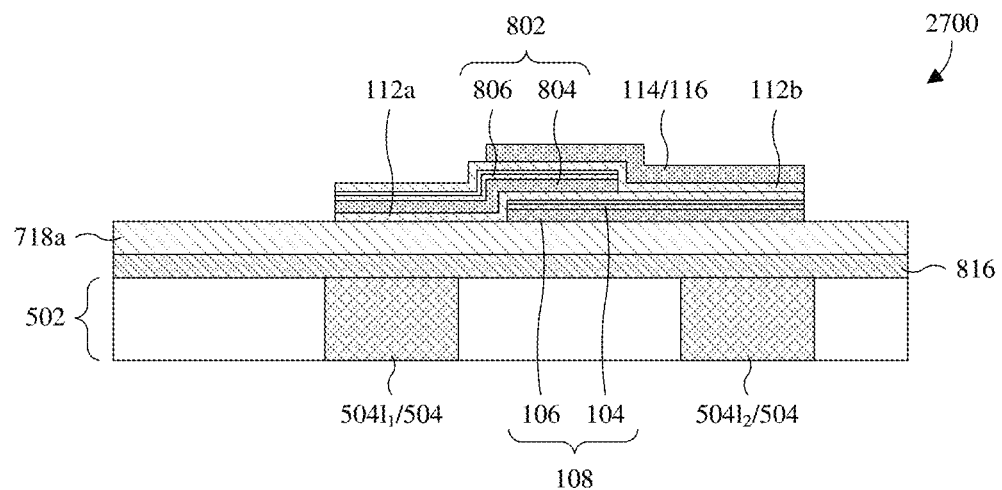

As illustrated by the cross-sectional view 2700 of FIG. 27, the TEL 114l (see, e.g., FIG. 26) is patterned to form a top electrode 114. The top electrode 114 comprises a crystalline TES 116 formed from the crystalline TEL 116l (see, e.g., FIG. 26). The patterning may, for example, be performed by a photolithography/etching process or some other suitable patterning process.

Figure 28:
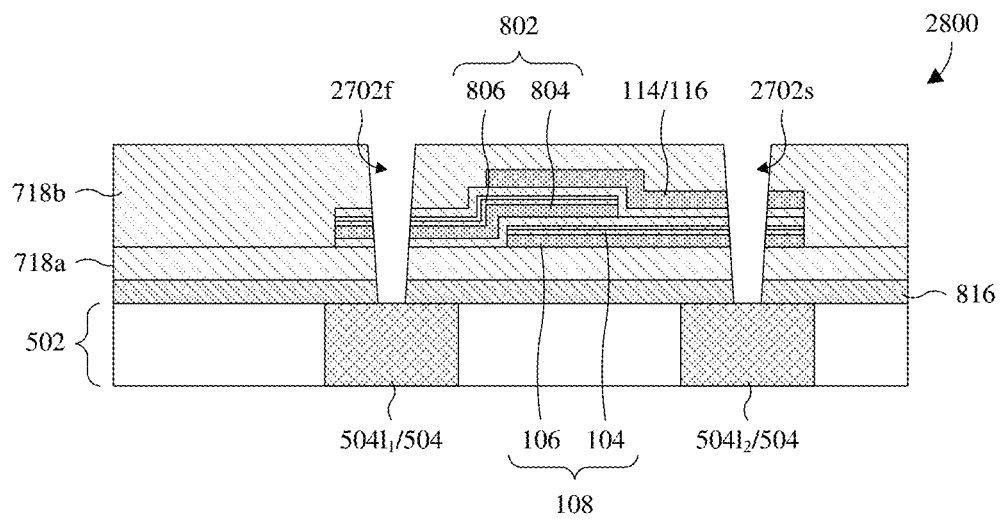

As illustrated by the cross-sectional view 2800 of FIG. 28, a second passivation layer 718b is deposited covering the top electrode 114 and the first passivation layer 718a. The second passivation layer 718b may, for example, be or comprise silicon oxide, silicon nitride, some other suitable dielectric(s), or any combination of the foregoing. In some embodiments, the second passivation layer 718b is the same material as the first passivation layer 718a.

Also illustrated by the cross-sectional view 2800 of FIG. 28, a patterning process is performed to form a first via opening 2702f and a second via opening 2702s respectively exposing the first and second lower capacitor wires 504$l_1$, 504$l_2$. The first via opening 2702f extends through the middle electrode 802 to the first lower capacitor wire 504$l_1$, whereas the second via opening 2702s extends through the top and bottom electrodes 114, 108 to the second lower capacitor wire 504$l_2$. The patterning may, for example, be performed by a photolithography/etching process or some other suitable patterning process. Etching during the photolithography/etching process may, for example, use the etch stop layer 816 as an etch stop to minimize damage to the first and second lower capacitor wires 504$l_1$, 504$l_2$.

Figure 29:
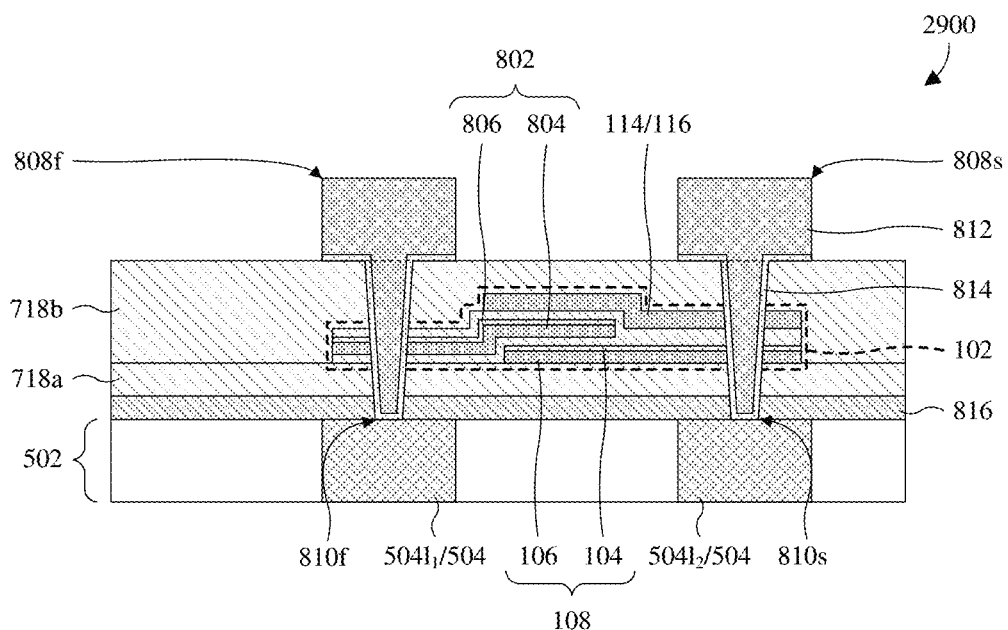

As illustrated by the cross-sectional view 2900 of FIG. 29, a first pad via 810f and a second pad via 810s are formed respectively filling the first and second via openings 2702f, 2702s (see, e.g., FIG. 28). Further, a first pad 808f and a second pad 808s are formed respectively on the first and second pad vias 810f, 810s, such that the first and second pad vias 810f, 810s extend respectively from the first and second pad vias 810f, 810s respectively to the first and second lower capacitor wires 504$l_1$, 504$l_2$. The first and second pads 808f, 808s and the first and second pad vias 810f, 810s are conductive and are formed from a liner layer 814 and a pad layer 812. The pad layer 812 may, for example, be or comprise aluminum copper, copper, aluminum, some other suitable conductive material(s), or any combination of the foregoing. The liner layer 814 may, for example, be or comprise titanium nitride, tantalum nitride, titanium, tantalum, some other suitable material(s), or any combination of the foregoing.

A process for forming the first and second pads 808f, 808s and the first and second pad vias 810f, 810s may, for example, comprise: 1) depositing the liner layer 814 covering second passivation layer 718b and lining the first and second via openings 2702f, 2702s; 2) depositing the pad layer 812 covering the liner layer 814 and filling a remainder of first and second via openings 2702f, 2702s; and 3) performing a photolithography/etching process to pattern the liner layer 814 an the pad layer 812 into the first and second pads 808f, 808s and the first and second pad vias 810f, 810s. Other suitable processes are, however, amenable.

The bottom and middle electrodes 108, 802 form a first capacitor and the middle and top electrodes 802, 114 form a second capacitor. Because the bottom electrode 108 comprises the amorphous BES 104, breakdown voltage and TDDB of the first capacitor are improved as described with regard to FIG. 1. Because the middle electrode 802 comprises the amorphous MES 806, breakdown voltage and TDDB of the second capacitor are similarly improved.

The first and second capacitors share the middle electrode 802, and the second pad via 810s electrically couples the bottom and top electrodes 108, 114 together. As such, the first and second capacitors are electrically coupled in parallel and form a MIM capacitor 102 with a total capacitance that is a sum of individual capacitances of the first and second capacitors. Further, because the first and second capacitors share the middle electrode 802, capacitance density of the MIM capacitor 102 is high.

Figure 30:
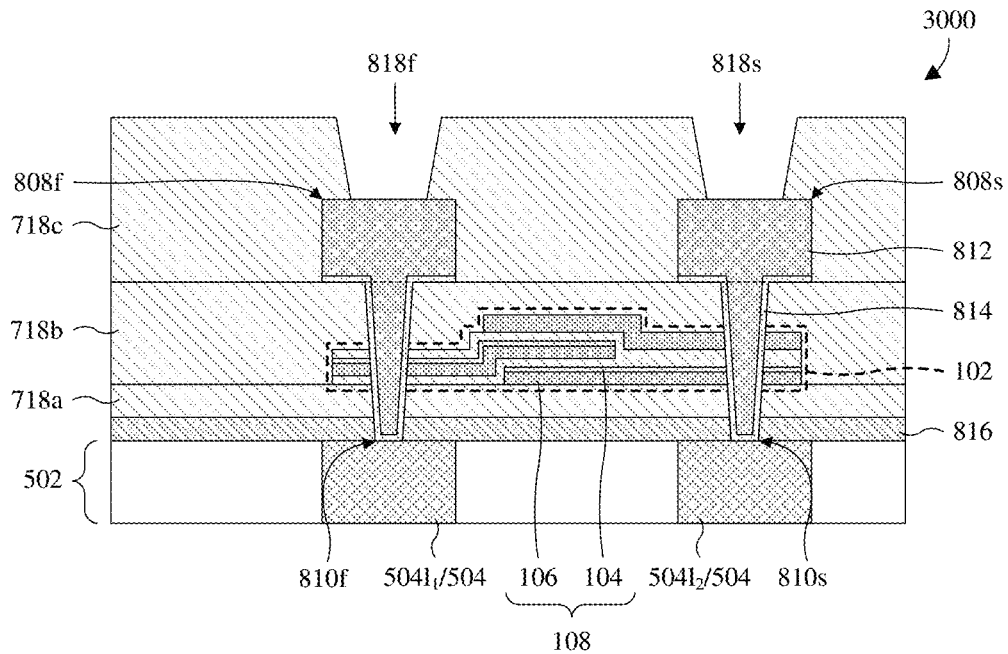

As illustrated by the cross-sectional view 3000 of FIG. 30, a third passivation layer 718c is deposited over the first and second pads 808f, 808s. The third passivation layer 718c may, for example, be or comprise silicon oxide, silicon nitride, some other suitable dielectric(s), or any combination of the foregoing. In some embodiments, the third passivation layer 718c is the same material as the first passivation layer 718a and/or the second passivation layer 718b.

Also illustrated by the cross-sectional view 3000 of FIG. 30, a patterning process is performed to form a first pad opening 818f and a second pad opening 818s respectively exposing the first and second pads 808f, 808s. The patterning may, for example, be performed by a photolithography/etching process or some other suitable patterning process.

While FIGS. 19-30 are described with reference to a method, it will be appreciated that the structures shown in FIGS. 19-30 are not limited to the method but rather may stand alone separate of the method. While FIGS. 19-30 are described as a series of acts, it will be appreciated that the order of the acts may be altered in other embodiments. While FIGS. 19-30 illustrate and describe as a specific set of acts, some acts that are illustrated and/or described may be omitted in other embodiments. Further, acts that are not illustrated and/or described may be included in other embodiments.

Figure 31:
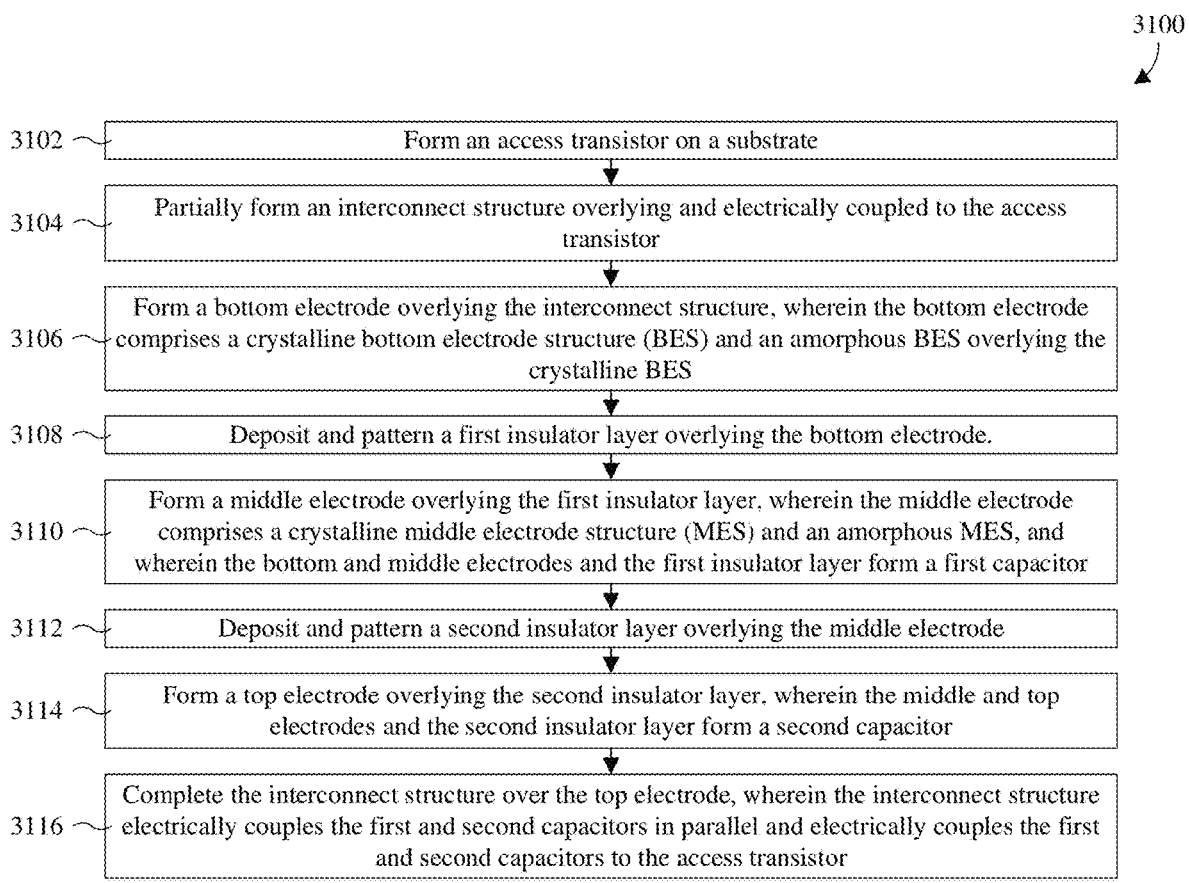
FIG. 31 illustrates a block diagram of some embodiments of the method of FIGS. 19-30.

With reference to FIG. 31, a block diagram 3100 of some embodiments of the method of FIGS. 19-30 is provided.

At 3102, an access transistor is formed on a substrate. See, for example, FIG. 19.

At 3104, an interconnect structure is partially formed overlying and electrically coupled to the access transistor. See, for example, FIG. 19.

At 3106, a bottom electrode is formed overlying the interconnect structure, wherein the bottom electrode comprises a crystalline BES and an amorphous BES overlying the crystalline BES. See, for example, FIGS. 20-22.

At 3108, a first insulator layer is deposited and patterned overlying the bottom electrode. See, for example, FIGS. 23 and 24.

At 3110, a middle electrode is formed overlying the first insulator layer, wherein the middle electrode comprises a crystalline MES and an amorphous MES, and wherein the bottom and middle electrodes and the first insulator layer form a first capacitor. See, for example, FIG. 25.

At 3112, a second insulator layer is deposited and patterned overlying the middle electrode. See, for example, FIG. 25.

At 3114, a top electrode is formed overlying the second insulator layer, wherein the middle and top electrodes and the second insulator layer form a second capacitor. See, for example, FIGS. 26 and 27.

At 3116, the interconnect structure is completed over the top electrode, wherein the interconnect structure electrically couples the first and second capacitors in parallel and electrically couples the first and second capacitors to the access transistor. See, for example, FIGS. 28-30.

While the block diagram 3100 of FIG. 31 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a MIM capacitor comprising: a bottom electrode; an insulator layer overlying the bottom electrode; and a top electrode overlying the insulator layer; wherein the bottom electrode comprises a crystalline structure and an amorphous structure overlying the crystalline structure. In some embodiments, the crystalline structure comprises a plurality of columnar crystalline grains at a top surface of the crystalline structure. In some embodiments, a thickness of the crystalline structure is greater than that of the amorphous structure. In some embodiments, the bottom electrode comprises a native oxide layer between and directly contacting the crystalline and amorphous structures. In some embodiments, the crystalline and amorphous structures are the same material. In some embodiments, the crystalline and amorphous structures are different materials. In some embodiments, the top electrode comprises a second crystalline structure and a second amorphous structure overlying the second crystalline structure.

In some embodiments, the present disclosures provides an IC comprising a MIM capacitor, wherein the MIM capacitor comprises: a bottom electrode; an insulator layer overlying the bottom electrode; and a top electrode overlying the insulator layer; wherein the bottom electrode comprises a first BES and a second BES overlying the first BES, wherein a top surface of the first BES has a first average roughness, and wherein a top surface of the second BES has a second average roughness less than the first average roughness. In some embodiments, the second average roughness is less than about 0.2 nanometers. In some embodiments, the top surface of the second BES has a lesser surface area than the top surface of the first BES. In some embodiments, the first BES and the second BES comprise titanium nitride. In some embodiments, the IC further comprises: a substrate; an alternating stack of wires and vias; a pad exposed from over the alternating stack; and a pad via extending from the pad to a wire of the alternating stack, wherein the pad via extends through the top electrode and the insulator layer. In some embodiments, the first BES and the second BES have a combined thickness less than about 60 nanometers. In some embodiments, the second BES is amorphous.

In some embodiments, the present disclosure provides a method comprising: depositing a crystalline BEL overlying a substrate; depositing an amorphous BEL overlying the crystalline BEL; depositing an insulator layer overlying the amorphous BEL; depositing a TEL overlying the insulator layer; and patterning the crystalline and amorphous BELs, the insulator layer, and the TEL to form a MIM capacitor. In some embodiments, the crystalline BEL is deposited by physical vapor deposition, wherein the amorphous BEL is deposited by atomic layer deposition. In some embodiments, the crystalline BEL and the amorphous BEL are deposited using a common deposition process. In some embodiments, the method further comprises performing a hydrogen gas HPA after the patterning, wherein hydrogen ions from the hydrogen gas HPA migrate to an interface between the insulator layer and the amorphous BEL. In some embodiments, the depositing of the TEL comprises: depositing a crystalline TEL overlying the insulator layer; and depositing an amorphous TEL overlying the crystalline TEL. In some embodiments, an interfacial layer forms atop the amorphous BEL from oxidation of the amorphous BEL, and the method further comprises plasma treating the interfacial layer with plasma formed from nitrous oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor comprising:
a bottom electrode;
an insulator layer overlying the bottom electrode;
an interfacial layer between the bottom electrode and the insulator layer; and
a top electrode overlying the insulator layer;
wherein the bottom electrode comprises a crystalline structure and an amorphous structure overlying the crystalline structure, and wherein hydrogen ions are at an interface at which the amorphous structure and the interfacial layer contact each other.

2. The MIM capacitor according to claim 1, wherein the top electrode comprises a second crystalline structure and a second amorphous structure overlying the second crystalline structure.

3. The MIM capacitor according to claim 1, wherein the top electrode directly contacts the insulator layer and is entirely amorphous.

4. The MIM capacitor according to claim 1, further comprising:
an additional interfacial layer between and directly contacting the crystalline structure and the amorphous structure, wherein the additional interfacial layer comprises native oxide of the crystalline structure.

5. The MIM capacitor according to claim 1, wherein the crystalline structure has a greater width than the amorphous structure.

6. An integrated circuit (IC) comprising a metal-insulator-metal (MIM) capacitor, wherein the MIM capacitor comprises:
a bottom electrode;
an insulator layer overlying the bottom electrode;
a diffusion barrier layer between and directly contacting the insulator layer and the bottom electrode, wherein the diffusion barrier layer comprises a metal oxynitride and is configured to block diffusion of oxygen; and a top electrode overlying the insulator layer;

wherein the bottom electrode comprises a first bottom electrode structure (BES) and a second BES overlying the first BES, wherein a top surface of the first BES has a first average roughness, and wherein a top surface of the second BES has a second average roughness less than the first average roughness.

7. The IC according to claim 6, wherein the bottom electrode and the diffusion barrier layer have individual top surfaces level with each other.

8. The IC according to claim 6, wherein the diffusion barrier layer comprises plasma-treated native oxide of the second BES.

9. The IC according to claim 6, further comprising:

a pad overlying the MIM capacitor; and a via extending from the pad to the top electrode, wherein the top electrode is amorphous continuously from direct contact with the insulator layer to the via.

10. The IC according to claim 6, wherein the top surface of the second BES has a lesser surface area than the top surface of the first BES.

11. The IC according to claim 6, further comprising:

a substrate;

an alternating stack of wires and vias;

a pad exposed from over the alternating stack; and a pad via extending from the pad to a wire of the alternating stack, wherein the pad via extends through the top electrode and the insulator layer.

12. The MIM capacitor according to claim 6, wherein the first BES comprises a plurality of columnar crystalline grains at the top surface of the first BES.

13. An integrated circuit (IC) comprising a metal-insulator-metal (MIM) capacitor, wherein the MIM capacitor comprises:

a bottom electrode;

a first insulator layer overlying the bottom electrode and extending along a sidewall of the bottom electrode;

a middle electrode overlying the first insulator layer;

a second insulator layer overlying the middle electrode and extending along a sidewall of the middle electrode, wherein the sidewall of the middle electrode faces an opposite direction as the sidewall of the bottom electrode; and a top electrode overlying the second insulator layer;

wherein the middle electrode comprises a crystalline structure and an amorphous structure overlying the crystalline structure, and wherein the top electrode, the first insulator layer, and the second insulator layer have individual sidewalls vertically stacked and edge to edge to form a common sidewall facing in the opposite direction.

14. The IC according to claim 13, wherein the sidewall of the middle electrode overlies the bottom electrode, laterally between the sidewall of the bottom electrode and the common sidewall.

15. The IC according to claim 13, wherein the crystalline structure directly contacts a top surface of the first insulator layer.

16. The IC according to claim 13, wherein the MIM capacitor further comprises a metal oxynitride layer between and directly contacting the second insulator layer and the amorphous structure.

17. The IC according to claim 13, wherein the bottom electrode comprises an additional crystalline structure and an additional amorphous structure overlying the additional crystalline structure.

18. The IC according to claim 13, further comprising:

a pair of wires underlying and spaced from the MIM capacitor;

a pair of pads overlying and spaced from the MIM capacitor; and a pair of vias extending respectively from the pair of wires respectively to the pair of pads, wherein one of the pair of vias directly contacts the middle electrode, and wherein another one of the pair of vias directly contacts the bottom electrode and the top electrode.

19. The MIM capacitor according to claim 1, wherein the crystalline structure and the amorphous structure are the same material and comprise a metal nitride.

20. The MIM capacitor according to claim 1, wherein a top surface of the amorphous structure has a first average roughness, and wherein a top surface of the top electrode has a second average roughness greater than the first average roughness.

* * * * *